(12) United States Patent
Takizawa et al.

(10) Patent No.: US 8,041,450 B2
(45) Date of Patent: Oct. 18, 2011

(54) POSITION SENSOR SYSTEM FOR SUBSTRATE TRANSFER ROBOT

(75) Inventors: Masahiro Takizawa, Tama (JP); Masaei Suwada, Tama (JP)

(73) Assignee: ASM Japan K.K. (JP)

( * ) Notice: Subject to any disclaimer, the term of this patent is extended or adjusted under 35 U.S.C. 154(b) by 1048 days.

(21) Appl. No.: 11/867,525

(22) Filed: Oct. 4, 2007

(65) Prior Publication Data

US 2009/0093906 A1 Apr. 9, 2009

(51) Int. Cl.
*G06F 19/00* (2011.01)
*G05B 15/02* (2006.01)

(52) U.S. Cl. ........... 700/214; 700/245; 700/258; 900/30

(58) Field of Classification Search ................ 700/214, 700/258, 245; 901/30
See application file for complete search history.

(56) References Cited

U.S. PATENT DOCUMENTS

| | | |
|---|---|---|
| 3,907,439 A | 9/1975 | Zanoni |
| 3,945,505 A | 3/1976 | Frisbie et al. |
| 4,024,944 A | 5/1977 | Adams et al. |
| 4,148,344 A | 4/1979 | Critchell et al. |
| 4,201,378 A | 5/1980 | Hams |
| 4,228,886 A | 10/1980 | Moran |
| 4,449,885 A | 5/1984 | Hertel et al. |
| 4,457,664 A | 7/1984 | Judell et al. |
| 4,466,073 A | 8/1984 | Boyan et al. |
| 4,507,078 A | 3/1985 | Tam et al. |
| 4,523,985 A | 6/1985 | Dimock |
| 4,559,451 A | 12/1985 | Curl |
| 4,635,373 A | 1/1987 | Miyazaki et al. |
| 4,647,268 A | 3/1987 | Scholl |
| 4,698,511 A | 10/1987 | Sueda et al. |
| 4,705,951 A | 11/1987 | Layman et al. |
| 4,720,635 A | 1/1988 | Uga |
| 4,744,713 A | 5/1988 | Hrovath |

(Continued)

FOREIGN PATENT DOCUMENTS

EP    0 282 233 A1    9/1988

(Continued)

OTHER PUBLICATIONS

Machine Translation of Japanese Publication No. JP 2005-093807, published Apr. 7, 2005.

(Continued)

*Primary Examiner* — Thomas Black
*Assistant Examiner* — Wae Louie
(74) *Attorney, Agent, or Firm* — Knobbe Martens Olson & Bear LLP

(57) ABSTRACT

A substrate processing apparatus comprises a substrate handling chamber, a pair of position sensors, and a substrate transfer robot. Each of the sensors comprises an emitter configured to emit a beam of light, and a receiver configured to receive the light beam. The substrate transfer robot comprises an end effector and a robot actuator. The end effector is configured to hold a substrate such that the substrate has a same expected position with respect to the end effector every time the substrate is held. The robot actuator is configured to move the end effector within the handling chamber to transfer substrates among a plurality of substrate stations. An edge of a substrate held in the expected position by the end effector can partially block a light beam of one of the position sensors, while another end of the end effector partially blocks a light beam of the other position sensor.

26 Claims, 10 Drawing Sheets

U.S. PATENT DOCUMENTS

| | | | |
|---|---|---|---|
| 4,765,793 A | 8/1988 | Goddeau | |
| 4,770,590 A | 9/1988 | Hugues et al. | |
| 4,789,294 A | 12/1988 | Sato et al. | |
| 4,818,169 A | 4/1989 | Schram et al. | |
| 4,819,167 A | 4/1989 | Cheng et al. | |
| 4,833,790 A | 5/1989 | Spencer et al. | |
| 4,838,733 A | 6/1989 | Katz | |
| 4,880,348 A | 11/1989 | Baker et al. | |
| 4,907,035 A | 3/1990 | Galburt et al. | |
| 5,044,752 A | 9/1991 | Thurfjell et al. | |
| 5,162,642 A | 11/1992 | Akamatsu et al. | |
| 5,194,743 A | 3/1993 | Aoyama et al. | |
| 5,239,182 A | 8/1993 | Tateyama et al. | |
| 5,483,138 A | 1/1996 | Shmookler et al. | |
| 5,563,798 A | 10/1996 | Berken et al. | |
| 5,706,201 A | 1/1998 | Andrews | |
| 5,706,930 A | 1/1998 | Sahoda et al. | |
| 5,740,062 A | 4/1998 | Berken et al. | |
| 5,768,125 A | 6/1998 | Zinger et al. | |
| 5,822,213 A | 10/1998 | Huynh | |
| 5,870,488 A | 2/1999 | Rush et al. | |
| 5,900,737 A | 5/1999 | Graham et al. | |
| 5,905,850 A | 5/1999 | Kaveh | |
| 5,917,601 A | 6/1999 | Shimazaki et al. | |
| 5,980,194 A | 11/1999 | Freerks et al. | |
| 6,198,976 B1 | 3/2001 | Sundar et al. | |
| 6,327,517 B1* | 12/2001 | Sundar | 700/245 |
| 6,485,248 B1* | 11/2002 | Taylor, Jr. | 414/672 |
| 6,502,054 B1 | 12/2002 | Mooring et al. | |
| 6,690,986 B1 | 2/2004 | Mitchell et al. | |
| 6,788,991 B2 | 9/2004 | De Haas et al. | |
| 6,856,863 B1* | 2/2005 | Sundar | 700/254 |
| 6,900,877 B2 | 5/2005 | Raaijmakers | |
| 6,996,456 B2* | 2/2006 | Cordell et al. | 700/258 |
| 7,008,802 B2* | 3/2006 | Lu | 438/7 |
| 7,039,501 B2* | 5/2006 | Freeman et al. | 700/258 |
| 7,100,954 B2* | 9/2006 | Klein et al. | 294/64.3 |
| 7,299,104 B2* | 11/2007 | Tezuka et al. | 700/112 |
| 7,319,920 B2* | 1/2008 | Donoso et al. | 700/254 |
| 7,360,981 B2* | 4/2008 | Weaver | 414/217 |
| 7,440,091 B2* | 10/2008 | Bagley et al. | 356/237.2 |
| 7,572,092 B2* | 8/2009 | Hofmeister et al. | 414/744.5 |
| 7,607,879 B2* | 10/2009 | Hall et al. | 414/217 |
| 7,694,647 B2* | 4/2010 | Ishikawa et al. | 118/503 |
| 7,834,994 B2* | 11/2010 | Bagley et al. | 356/237.2 |
| 7,880,155 B2* | 2/2011 | Krupyshev et al. | 250/559.3 |
| 2002/0098818 A1 | 7/2002 | Yokogawa et al. | |
| 2003/0197563 A1 | 10/2003 | Nishizono | |
| 2004/0240971 A1 | 12/2004 | Tezuka et al. | |
| 2005/0100435 A1 | 5/2005 | Dickinson | |
| 2007/0052646 A1 | 3/2007 | Ishiguchi | |
| 2009/0093906 A1* | 4/2009 | Takizawa et al. | 700/214 |
| 2009/0252580 A1 | 10/2009 | Takizawa et al. | |
| 2010/0003833 A1 | 1/2010 | Tsuji et al. | |

FOREIGN PATENT DOCUMENTS

| | | |
|---|---|---|
| EP | 0 313 466 A2 | 4/1989 |
| EP | 0 597 637 A1 | 5/1994 |
| JP | 58-055270 | 4/1983 |
| JP | 61-087352 | 5/1986 |
| JP | 61-184842 | 8/1986 |
| JP | 61-228639 | 10/1986 |
| JP | 62-073643 | 4/1987 |
| JP | 11-347975 | 12/1999 |
| JP | 2005-093807 | 4/2005 |
| WO | WO 99/52686 | 10/1999 |

OTHER PUBLICATIONS

ASM Europe, (Advance 400 Course Module 19), Rev. C, Jun. 1999.

Brooks Automation, (Wafer Handling Robot), Solid State Technology, vol. 28, No. 1, Jan. 1985, p. 74.

Deguchi et al., "Alignment accuracy evaluation of x-ray lithography system SR-1," Journal of the Japan Society of Precision Engineering, 1985, vol. 51, No. 5, pp. 156-162.

GCA Corporation, (Wafertrac1006 Advertisement), Solid State Technology, vol. 28, No. 1, Jan. 1985, p. 3.

IBM Technical Disclosure Bulletin, "Automatic mask/wafer alignment system," Sep. 1975, vol. 28, No. 4, pp. 1474-1479.

IBM Technical Disclosure Bulletin, "Vacuum-compatible low contamination wafer-orientor system," Feb. 1986, vol. 28, No. 9, pp. 4056-4058.

IBM Technical Disclosure Bulletin, "No-edge contact wafer orientor," Jan. 1975, vol. 17, No. 8, pp. 2220-2221.

IBM Technical Disclosure Bulletin, "Front wafer registration device for batch process etch end-pint detection system," Oct. 1977, vol. 20, No. 5, pp. 1756-1759.

Keyence Corporation Brochure, "Laser thrubeam photoelectric sensors LX2 series," Date unknown.

Petersen et al., "High-performance mass-flow sensor with integrated laminar flow micro-channels," International Conference on Solid State Sensors and Actuators—Digest of Technical Papers, 1985, pp. 361-363.

Wojcik, Zbigniew M., "A method of automatic centering of chips, masks and semiconductor wafers," Electron Technology, 1977, vol. 10, No. 3, pp. 79-96.

* cited by examiner

| Operation step | Illustration of robot |
|---|---|
| (Lower arm) Wafer retrieval standby | 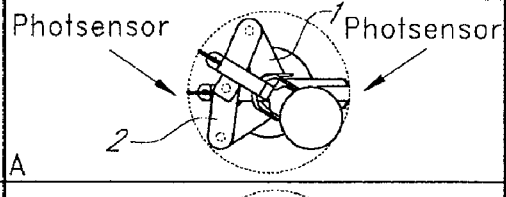 Photsensor    Photsensor  2  A |
| (Lower arm) Wafer retrieval start | 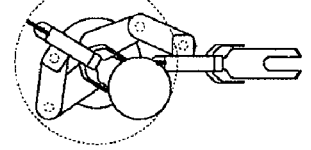 B |
| (Lower arm) Wafer retrieval | 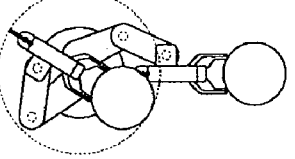 C |
| (Lower arm) Wafer retrieval completion | 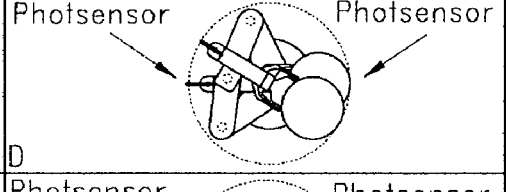 Photsensor    Photsensor  D |
| (Upper arm) Wafer placement standby | 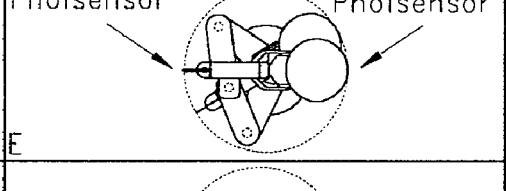 Photsensor    Photsensor  E |
| (Upper arm) Wafer placement start | 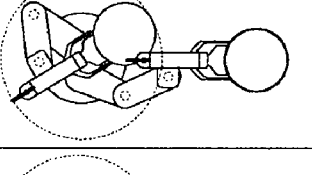 F |
| (Upper arm) Wafer placement | 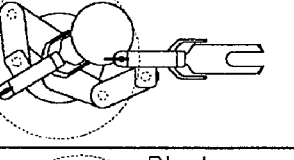 G |
| (Upper arm) Wafer placement completion | 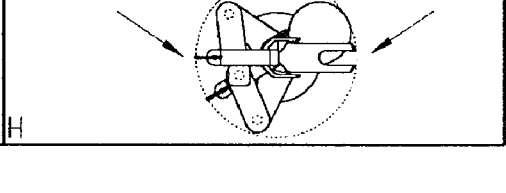 Photsensor    Photsensor  H |

*FIG. 13*

POSITION SENSOR SYSTEM FOR SUBSTRATE TRANSFER ROBOT

BACKGROUND

1. Field

The present application relates generally to substrate processing and, more particularly, to methods and apparatuses for transferring substrates through a substrate processing system.

2. Description of the Related Art

An apparatus for processing semiconductor substrates, such as silicon wafers, typically includes a processing chamber in which the substrates are processed, a substrate handling chamber through which the substrates are moved before and after processing in the processing chamber, and one or more input/output chambers that store substrates before and after the substrates are moved through the handling chamber. A substrate transfer robot is located within the handling chamber and is configured to transfer substrates to and from a plurality of stations. Such stations may be within the handling chamber, the input/output chambers, the processing chamber, or other chambers. A typical station within the processing chamber is a substrate holder, such as a susceptor, which supports a substrate during processing. A station within the input/output chamber may comprise a cassette that holds a plurality of substrates. The input/output chambers may be loading chambers or load ports that contain substrate cassettes that are accessible by the transfer robot. The input/output chambers can also be load-lock chambers in which substrates can be atmospherically isolated and purged of particulates before being moved into the handling chamber and eventually into the processing chamber. Other stations, which can be inside separate chambers or even within the substrate handling chamber, may include pre-processing stations (such as a wafer pre-cleaning station) and/or post-processing stations (such as a cooling station).

The substrate transfer robot typically includes an actuator, one or more interlinked arms, and an end effector attached to the arms. The actuator is configured to move the arms and the end effector. The end effector is adapted to pick up a substrate from a station, hold the substrate as the robot moves the end effector and the substrate to another station, and place the substrate at another station. A variety of different types of end effectors exist, including paddles and Bernoulli wands.

In so-called cluster tools, the apparatus includes a plurality of processing chambers each typically adjacent to the substrate handling chamber. The processing chambers are capable of processing substrates simultaneously, which increases the overall substrate throughput of the apparatus. The handling chamber may include more than one substrate transfer robot for improved substrate handling capability.

Substrates must often be placed with great accuracy. A typical susceptor for holding a semiconductor wafer has a wafer pocket whose size is only slightly larger than that of a wafer that the susceptor is designed to support. For example, a susceptor designed to support a 300 mm wafer might have a wafer pocket with a diameter of only 301 mm, providing a clearance of only 0.5 mm between the edge of the supported wafer and the pocket's perimeter wall. It is important that the wafer be centered in the pocket and not touch the pocket wall. If the wafer contacts the pocket wall, local temperature changes occur, resulting in temperature gradients across the wafer. This can cause non-uniformity in process results, as most semiconductor processing depends critically on temperature.

Errors in placement of the substrate relative to an end effector, known as "substrate drift," are sometimes caused by variations in substrate position in the cassette at pickup. In other words, at pickup the end effector may attach to each substrate at a slightly different location. Substrate drift can also occur during robot movement, particularly when the robot moves fast. In addition to the aforementioned problems associated with failing to center the substrate within a susceptor pocket, substrate drift can result in damage to the substrate during placement at a substrate station, such as a wafer cassette.

One method of solving these problems associated with substrate drift involves the use of at least two photosensors in the wafer handling chamber. For example, U.S. Pat. No. 7,008,802 discloses using photosensors that sense an extent to which an edge of the wafer blocks a light beam emitted by the photosensor. By measuring the extent to which the wafer edge blocks the light beams of the photosensors, the position of the wafer is calculated and compared to a pre-registered normal position to calculate an offset displacement to be applied to the robot to compensate for the calculated positioning error. Another reference that discloses using two photosensors to calculate a position of a wafer is Japanese Patent Laid-open No. 2005-93807.

SUMMARY

In one aspect, the present application discloses a semiconductor substrate processing apparatus, comprising a substrate handling chamber, a pair of position sensors, and a substrate transfer robot within the handling chamber. Each of the sensors comprises a light beam emitter configured to emit a beam of light, and a receiver configured to receive the light beam. The substrate transfer robot comprises an elongated end effector and a robot actuator. The end effector has a distal end and a proximal end. The end effector is configured to pick up and hold a semiconductor substrate at the distal end such that the substrate has a same expected position with respect to the end effector every time the substrate is picked up and held by the end effector. The robot actuator is configured to move the end effector within the handling chamber to transfer substrates among a plurality of substrate stations. The end effector has a length such that it is possible for an edge of a substrate held in the expected position by the end effector to partially block a light beam emitted from the emitter of one of the position sensors, while the proximal end of the end effector partially blocks a light beam emitted from the emitter of the other position sensor.

In another aspect, the present application discloses a method of controlling a semiconductor substrate transfer robot. The method comprises providing a pair of position sensors, each sensor comprising a light beam emitter and a receiver. The emitter is configured to emit a beam of light, and the receiver is configured to receive the light beam from the emitter. The method also includes providing a substrate transfer robot within the handling chamber, providing an elongated end effector, and providing a robot actuator configured to move the end effector within the handling chamber to transfer substrates among a plurality of substrate stations. The end effector has a distal end and a proximal end and is configured to pick up and hold a semiconductor substrate at the distal end such that the substrate has a same expected position with respect to the end effector every time the substrate is picked up and held by the end effector. The end effector has a length such that it is possible for an edge of a substrate held in the expected position by the end effector to partially block a light beam emitted from the emitter of one of the position sensors, while the proximal end of the end effector partially blocks a light beam emitted from the emitter of the other position sensor.

In still another aspect, the present application discloses a semiconductor processing apparatus, comprising a substrate handling chamber, a second substrate chamber adjacent to the handling chamber, a port between the handling chamber and the second chamber, an end effector inside the handling chamber, a robot actuator, a position sensor, and a control system. The end effector comprises a paddle and a proximal clamping member. The paddle has a distal end defining a distal end of the end effector. The paddle also has one or more clamping elements adapted to clamp against an edge of a substrate supported by the paddle. The proximal clamping member has one or more proximal clamping elements adapted to clamp against an edge of a substrate supported by the paddle. The proximal clamping member is adapted to move toward and away from the distal end of the paddle to clamp and unclamp a substrate between the clamping elements of the paddle and the clamping elements of the proximal clamping member. The proximal clamping member also has a proximally extending structure that defines a proximal end of the end effector. The robot actuator is configured to move the end effector within the handling chamber to transfer substrates among a plurality of substrate stations. The position sensor comprises a light beam emitter configured to emit a beam of light, and a receiver configured to receive the light beam. The control system is programmed to instruct the robot actuator to move the end effector to a target position in which the end effector is oriented along a line extending from the sensor to the port, and in which the distal end of the paddle points toward the port. The control system is also programmed to determine an amount of light received by the receiver from the emitter, and to control movements of the end effector based on the measured amount of light.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 13 is an illustration of an example sequence of operational steps performed by a pair of substrate transfer robots within a substrate handling chamber, in accordance with an embodiment.

DETAILED DESCRIPTION OF THE PREFERRED EMBODIMENTS

One problem with the above-described conventional methods of detecting substrate drift is that the robot arms sometimes interfere with the light beams emitted by the photosensors, which prevents detection of the substrate position. Each photosensor typically includes a light beam emitter above the end effector and oriented to emit a beam of light downwardly, and a light beam receiver below the end effector and configured to receive the beam of light from the emitter. The robot arms, in certain positions, can block the light beams and thereby interfere with the sensors' ability to sense the substrate position. Also, in apparatuses having multiple robots holding multiple substrates simultaneously, the substrates often overlap each other, and sometimes it is not possible to determine which substrate is being detected. Further, in some cases a photosensor's light beam is impeded by two different substrates, which results in a distorted calculation of the targeted substrate's position.

Figure 1:
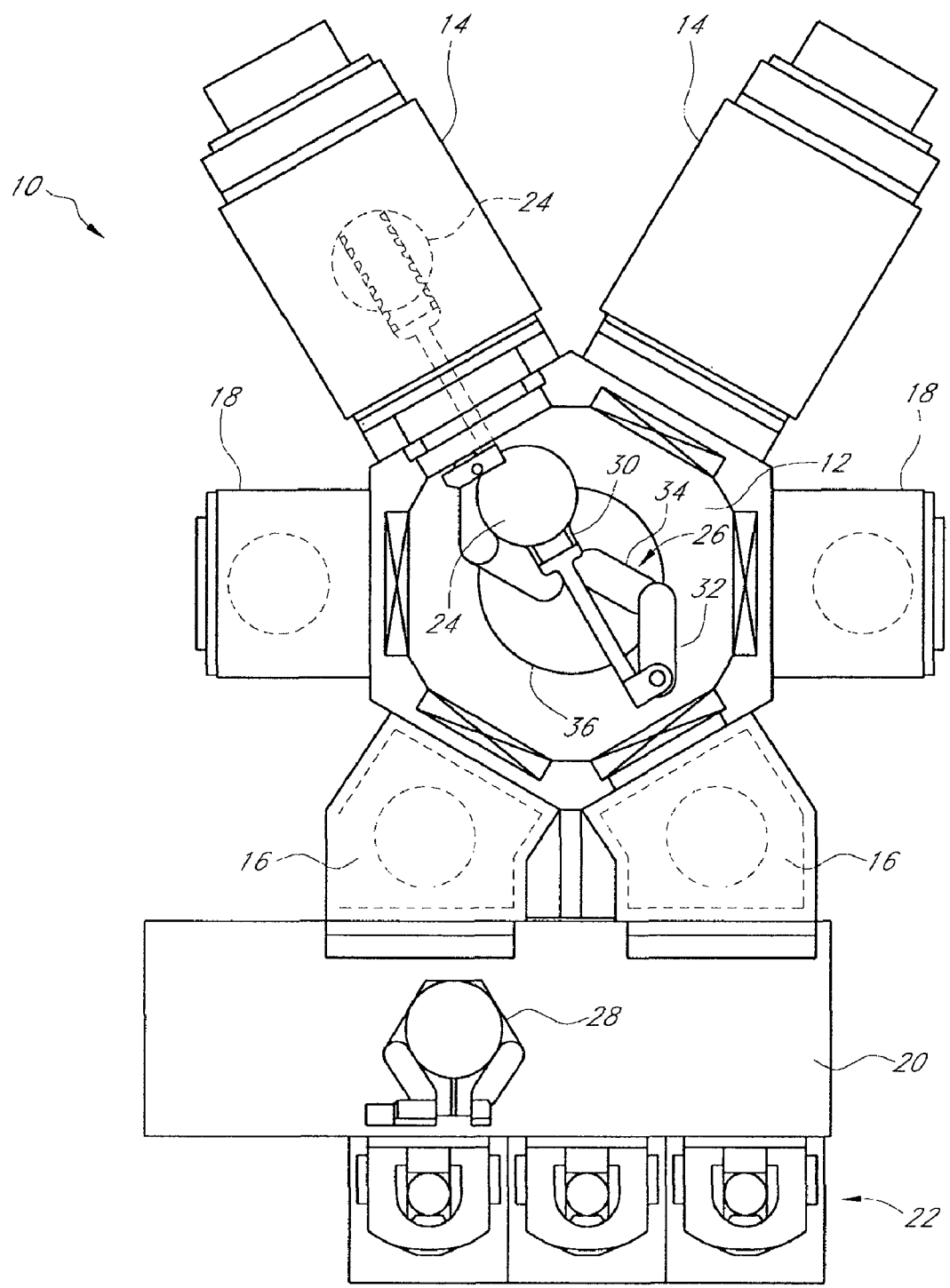
FIG. 1 is a schematic top view of a conventional semiconductor processing apparatus.

For example, FIG. 1 shows a conventional semiconductor processing apparatus 10 for processing semiconductor substrates, such as silicon wafers. The apparatus 10 includes a wafer handling chamber 12, two processing chambers 14, two load lock chambers 16, two cooling chambers 18, a front end wafer handling chamber 20, and a load port 22. The wafer handling chamber 12 includes a wafer transfer robot 26, and the front end wafer handling chamber 20 includes a wafer transfer robot 28.

In use, the robot 28 collects wafers 24 from wafer collection devices, such as wafer cassettes or so-called FOUPs (front opening unified pods), at the load port 22, and delivers the wafers 24 to the load lock chambers 16. The robot 28 also delivers processed wafers 24 back to the wafer collection devices at the load port 22. The load lock chambers 16 can be sealed to isolate and purge the wafers 24 prior to being moved into the handling chamber 12, processing chambers 14, and cooling chambers 18. The robot 26 picks up the wafers 24 from the load lock chambers 16 and delivers the wafers to the processing chambers 14 and cooling chambers 18 for wafer processing. The robot 26 handles all of the wafer pickups and deliveries to and from the chambers 14 and 18.

The robot 26 includes an end effector in the form of a paddle 30, which is configured to pickup a wafer 24, support the wafer during a wafer transfer step, and then deliver the wafer to a target station. The robot 26 also includes arms 32 and 34. The arm 32 has one end rotatably linked to the paddle 30, and another end rotatably linked to an end of the arm 34. The arm 34 has an opposite end rotatably linked to an elevator 36 that moves the robot 26 vertically. The elevator 36 can also be configured to rotate about a vertical axis to facilitate rotation of the robot 26. As shown, the robot 26 is capable of moving a wafer 24 into and out of a processing chamber 14 and a cooling chamber 18.

Figure 2:
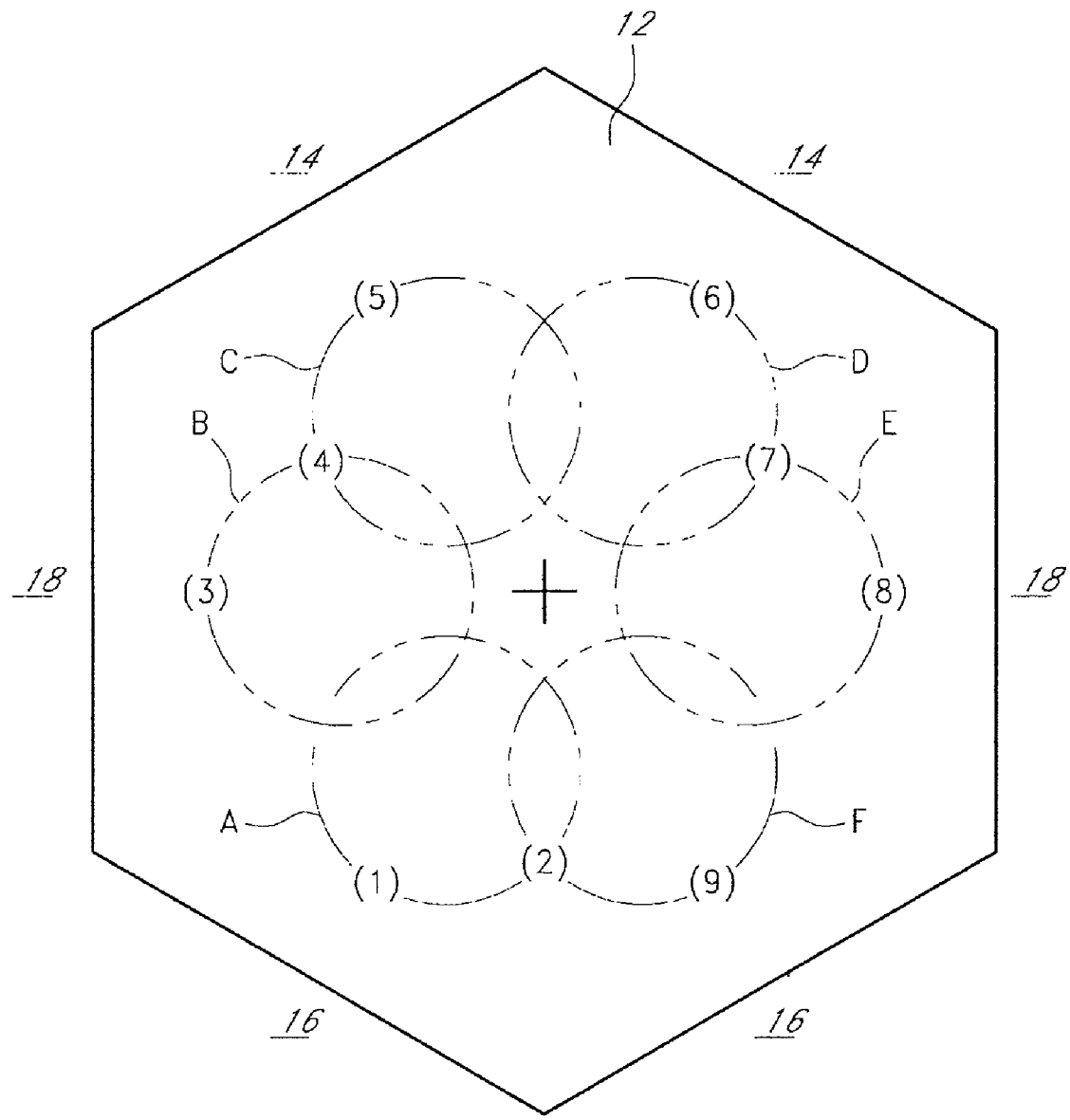
FIG. 2 is a schematic top view of a wafer handling chamber of the conventional semiconductor processing apparatus of FIG. 1.

FIG. 2 is a schematic top view of the conventional wafer handling chamber 12 of FIG. 1. The handling chamber 12 has six target positions A, B, C, D, E, and F of a wafer, for delivery into the chambers adjacently surrounding the handling chamber 12. In particular, the positions A and F are associated with the load lock chambers 16, the positions B and E are associated with the cooling chambers 18, and the positions C and D are associated with the processing chambers 14. Position photosensors 1-9 are located in the handling chamber 12, at positions along the edges of wafers at target positions A-F. Each photosensor produces a vertical beam of light that will be partially impeded by a wafer in the associated target position. Each target position A-F has two of photosensors 1-9 along its edge, which is sufficient to calculate the wafer position.

A problem with this arrangement is that the paddle 30 and arms 32, 34 can impede the light beams emitted by the photosensors 1-9, making it impossible to detect the wafer position. Also, if two or more wafer transfer robots 26 holding multiple wafers are provided in the handling chamber 12, it is sometimes not possible to determine which wafer a particular photosensor is sensing. For example, if one robot positions a wafer roughly at target position A, and another robot positions a wafer roughly at target position F, then the light beam emitted by photosensor 2 may become partially impeded by both wafers, which will result in a distorted calculation of the position of the wafer intended to be sensed. Also, one wafer may completely block the light beam while the other wafer is correctly positioned, which will also distort the system's understanding of the wafer positions.

Figure 3:
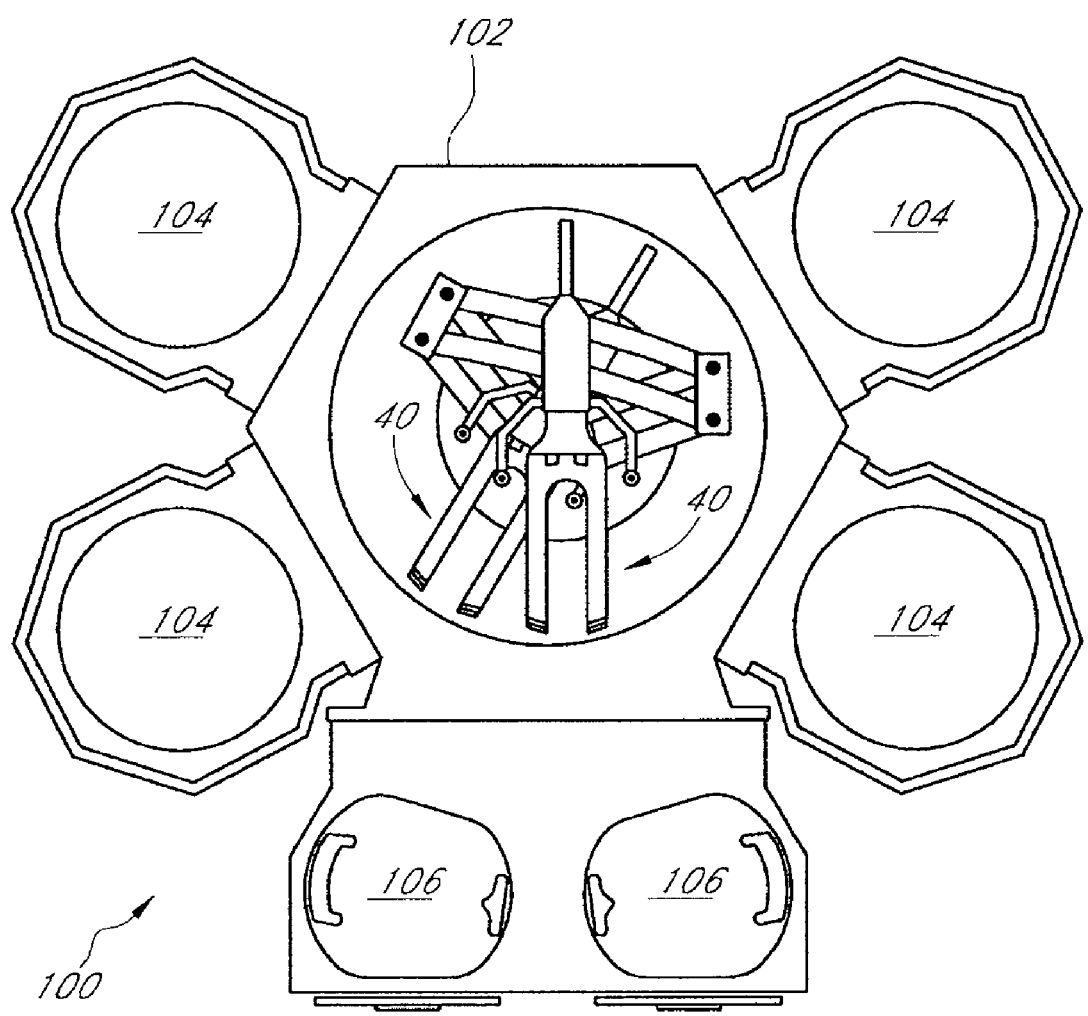
FIG. 3 is a schematic top view of an embodiment of a semiconductor processing apparatus.

FIG. 3 is a schematic top view of a semiconductor processing apparatus 100 for processing semiconductor substrates, such as silicon wafers, in accordance with one embodiment. The apparatus 100 includes a substrate handling chamber 102, four substrate processing chambers 104, and two input/output chambers 106. The chambers 104 and 106 are preferably adjacent to the handling chamber 102. The processing chambers 104 preferably include substrate holders, such as susceptors, for supporting substrates during substrate processing, such as chemical vapor deposition, atomic layer deposition, physical vapor deposition, photolithography, etching, plasma-enhanced deposition, etc. The processing chambers 104 can be single substrate processing chambers, or batch substrate chambers.

The input/output chambers 106 may comprise substrate loading chambers that contain substrate collection devices, such as substrate cassettes or FOUPs. Alternatively, the input/output chambers 106 can comprise load-lock chambers in which substrates can be atmospherically isolated and purged of particulates before being moved into the handling chamber 102 and eventually into the processing chambers 104. The illustrated substrate handling chamber 102 includes two substrate transfer robots 40, such as vacuum robots, adapted to pickup, transfer, and deliver substrates among the chambers 104 and 106.

Figure 4:
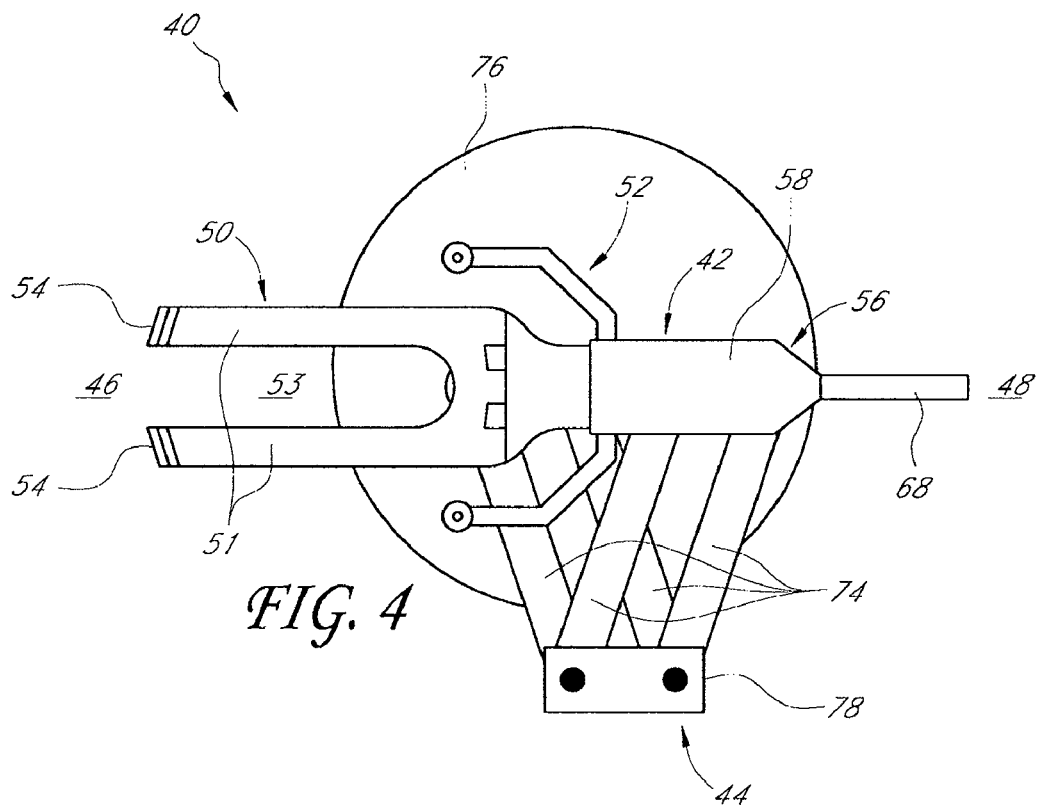
FIG. 4 is a top view of an embodiment of a substrate transfer robot.

FIG. 4 is a top view of a substrate transfer robot 40 in accordance with one embodiment of the present application. If multiple robots 40 are provided within the substrate handling chamber 102 (FIG. 3), then they are preferably configured identically. The illustrated robot 40 includes an elongated end effector 42 and a robot actuator 44. The end effector 42 has a distal end 46 and a proximal end 48, and is configured to pick up and hold a semiconductor substrate at the distal end 46. The robot actuator 44 is configured to move the end effector 42 within the substrate handling chamber 102 to transfer substrates among a plurality of substrate stations (such as stations inside the chambers 104 and 106).

Figure 5:
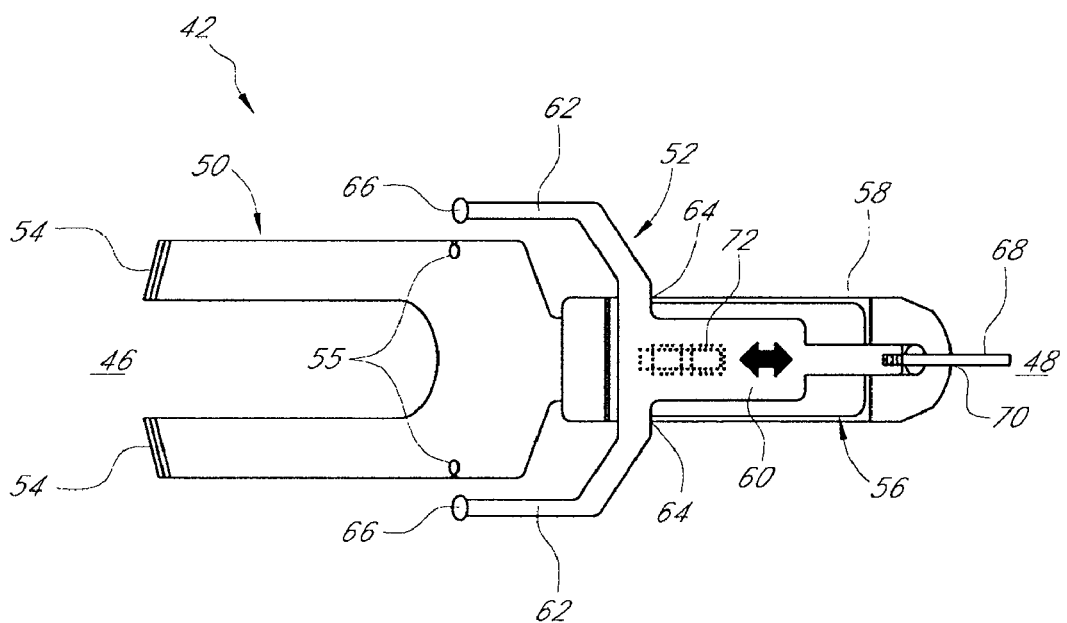
FIG. 5 is a cross-sectional view of an end effector of the substrate transfer robot of FIG. 4.

The end effector 42, also referred to as a substrate clamper or wafer clamper, preferably includes a paddle 50 and a proximal clamping member 52. The paddle 50 is preferably configured to underlie and support a substrate. In the illustrated embodiment, the paddle 50 has two prongs 51 defining an inner slot 53. However, in an alternative embodiment the paddle 50 has no prongs 51 or slot 53. The paddle 50 has a distal end that defines the distal end 46 of the end effector 42. The paddle 50 has one or more forward clamping elements 54 configured to clamp against an edge of a substrate held by the end effector 42. In the illustrated embodiment, the clamping elements 54 comprise upstanding flanges. However, structures other than flanges can be used instead. In the illustrated embodiment, the clamping elements 54 are at the distal end of the paddle 50. However, the clamping elements 54 can alternatively be located somewhat rearward of the distal end of the paddle 50. As shown in FIG. 5, the paddle 50 can include spacers 55, such as spacer pins, on which a substrate can rest.

With reference to FIGS. 4 and 5, the illustrated paddle 50 has a proximal portion 56 comprising a sleeve 58 that is connected to the robot actuator 44. The sleeve 58 houses a body portion 60 of the proximal clamping member 52. The clamping member 52 preferably includes one or more clamping elements 66 configured to clamp against an edge of a substrate held by the end effector 42. In the illustrated embodiment, the clamping member 52 includes a pair of arms 62 that extend laterally and distally from the body portion 60. Sidewalls of the sleeve 58 include slots 64 through which the arms 62 extend laterally and emerge from inside the sleeve 58. Each arm 62 includes one clamping element 66. The slots 64 are preferably slightly longer than the width of the portions of the arms 62 that extend therethrough, such that the clamping member 52 is movable toward and away from the distal end 46 of the end effector 42. A linear actuator 72 can be provided for producing such movement of the clamping member 52 with respect to the sleeve 58. The actuator 72 can be electrically controlled. The clamping member 52 preferably also includes a rear flag 68 that extends proximally through an orifice 70 of the sleeve 58. The function of the flag 68 is discussed below. In one embodiment, the length of travel of the clamping member 52 with respect to the paddle 50, and hence the minimum length of the slot 64, is about 2 mm.

With continued reference to FIG. 4, the illustrated robot actuator 44 includes a plurality of interlinked arms 74. Two lower arms 74 have first ends rotatably linked with respect to an elevator 76 and second ends rotatably linked to an elbow member 78. Two upper arms 74 have first ends rotatably linked to the elbow member 78 and second ends rotatably linked to the end effector 42. The elevator 76 is preferably configured to move the robot 40 vertically and to rotate about a vertical axis with respect to a floor of the substrate handling chamber 102 (FIG. 3). It will be appreciated that a variety of different types of robot actuators 44 can be provided in place of the illustrated embodiment.

Figure 6:
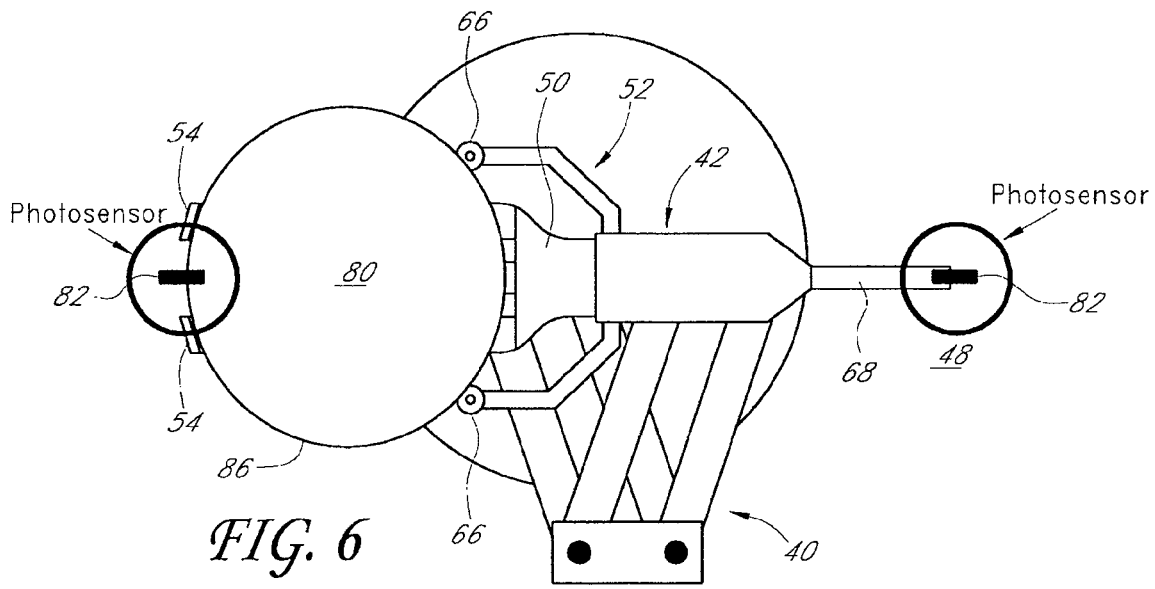
FIG. 6 is a top view of the substrate transfer robot of FIG. 4 clamping a substrate, shown in relation to a pair of position sensors.

With reference to FIGS. 4-6, a preferred substrate-clamping functionality of the illustrated end effector 42 is now described. First, the paddle 50 is positioned underneath a substrate 80, such that the substrate is supported on the paddle. In the illustrated embodiment, the substrate 80 is supported on the spacers 55. Then the proximal clamping member 52 is moved in a distal direction to clamp the substrate 80 between the clamping elements 54 of the paddle 50 and the clamping elements 66 of the clamping member 52. In one embodiment, the clamping member 52 is moved distally by a linear actuator 72, described above. In the illustrated embodiment, the four clamping members 54, 66 allow the end effector 42 to hold the substrate 80 in a repeatable, expected position, shown in FIG. 6. In other words, the substrate 80 has the same expected position with respect to the end effector 42 every time the substrate is picked up and held by the end effector. When the end effector 42 needs to release the substrate 80, the clamping member 52 is moved in the proximal direction to unclamp the substrate.

Figure 7:
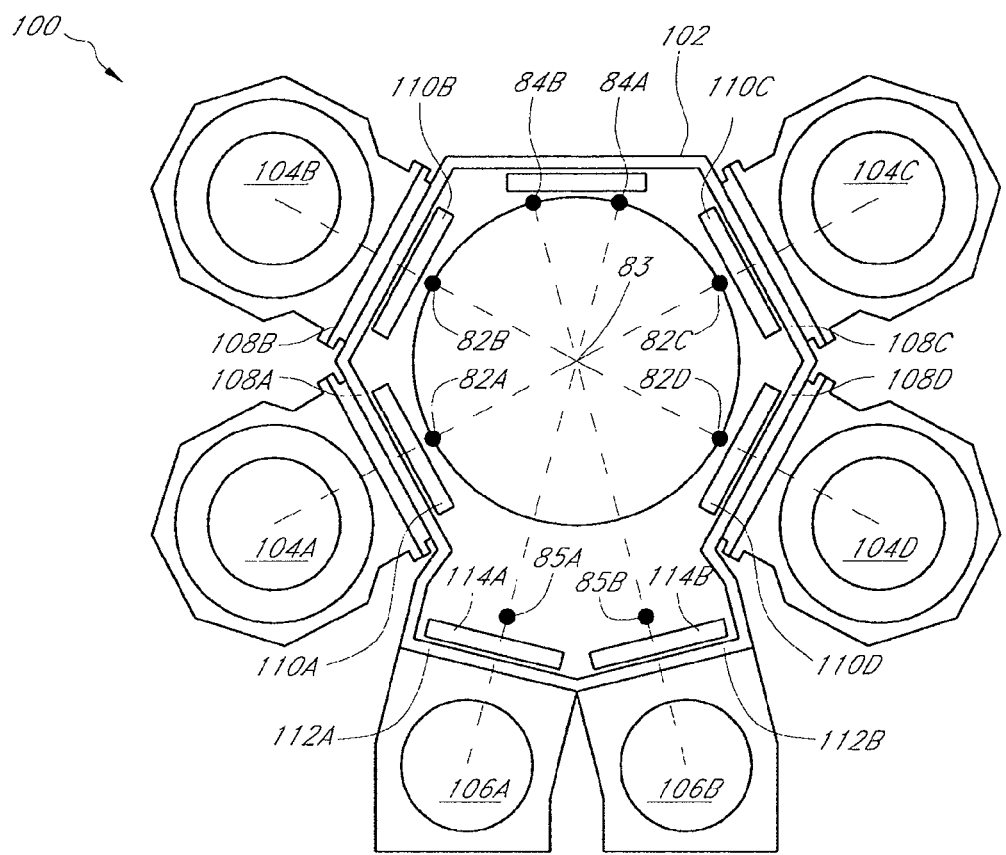
FIG. 7 is a schematic top view of the semiconductor processing apparatus of FIG. 3 illustrating position sensors.

With reference to FIG. 7, a preferred embodiment of the semiconductor processing apparatus 100 includes four processing chambers 104A, 104B, 104C, and 104D, and two input/output chambers 106A and 106B. For each processing chamber 104, there is preferably an associated processing chamber port 108 in the wall between the handling chamber 102 and the chamber 104. Accordingly, the illustrated handling chamber 102 includes processing chamber ports 108A, 108B, 108C, and 108D associated with processing chambers 104A, 104B, 104C, and 104D, respectively. Each of the processing chamber ports 108 is preferably sized to allow an end effector 42 of one of the robots 40 (FIG. 3) to pass through the processing chamber port 108 while the end effector is holding a substrate in the above-described expected position associated with the end effector.

Preferably, the processing chambers 104 are provided in pairs positioned on opposing sides of the handling chamber 102, such that their associated processing chamber ports 108 face one another. In the illustrated embodiment, the apparatus 100 includes a first pair of processing chambers 104A and 104C, and a second pair of processing chambers 104B and 104D. The illustrated apparatus 100 also includes a first pair of processing chamber ports 108A and 108C, and a second pair of processing chamber ports 108B and 108C. The ports 108A and 108C are on opposing sides of the handling chamber 102 and face one another, and the ports 108B and 108D are also on opposing sides of the handling chamber 102 and also face one another.

The apparatus 100 preferably includes a plurality of gate valves 110 each configured to isolate one of the processing chambers 104 from the handling chamber 102. In the illustrated embodiment, the apparatus 100 includes gate valves 110A, 110B, 110C, and 110D, which are configured to isolate the processing chambers 104A, 104B, 104C, and 104D, respectively, from the handling chamber 102. Each gate valve 110 preferably has an open position and a closed position. Each gate valve 110 in its open position preferably allows an end effector 42 to pass through the gate valve 110 and through one of the processing chamber ports 108 while the end effector is holding a substrate 80. Each gate valve 110 in its closed position preferably seals one of the processing chamber ports 108.

The apparatus 100 preferably includes a plurality of position sensors 82 each located by one of the processing chamber ports 108, such that there is one sensor 82 for each processing chamber 104 and port 108. In the illustrated embodiment, the apparatus 100 includes position sensors 82A, 82B, 82C, and 82D within the substrate handling chamber 102. Like the reaction chambers 104, ports 108, and gate valves 110, the position sensors 82 are preferably provided in pairs. In the illustrated embodiment, the sensors 82A and 82C form a first pair, and the sensors 82B and 82D form a second pair. The functionality of the sensors 82 is described below.

The apparatus 100 preferably also includes input/output ports 112 between the handling chamber 102 and the input/output chambers 106. In the illustrated embodiment, the apparatus 100 includes input output ports 112A and 112B associated with the chambers 106A and 106B, respectively. Each input/output port 112 is preferably sized to allow an end effector 42 to pass through the input/output port while the end effector is holding a substrate in the expected position associated with the end effector.

The apparatus 100 preferably includes a gate valve 114 for each input/output chamber 106. Each gate valve 114 is preferably configured to isolate its associated input/output chamber 106 from the handling chamber 102. In the illustrated embodiment, the apparatus 100 includes gate valves 114A and 114B, which are configured to isolate the input/output chambers 106A and 106B, respectively, from the handling chamber 102. Each gate valve 114 preferably has an open position and a closed position. Each gate valve 114 in its open position preferably allows an end effector 42 to pass through the gate valve 114 and through one of the input/output ports 112 while the end effector is holding a substrate 80. Each gate valve 114 in its closed position preferably seals one of the input/output ports 112.

The apparatus 100 preferably includes input/output position sensors 84 each positioned on a side of the handling chamber 112 opposite one of the input/output ports 112. In the illustrated embodiment, the apparatus 100 includes input/output position sensors 84A and 84B. The sensor 84A is positioned opposite the input/output port 112A, and the sensor 84B is positioned opposite the input/output port 112B. The functionality of the sensors 84 is described below.

Figure 8:
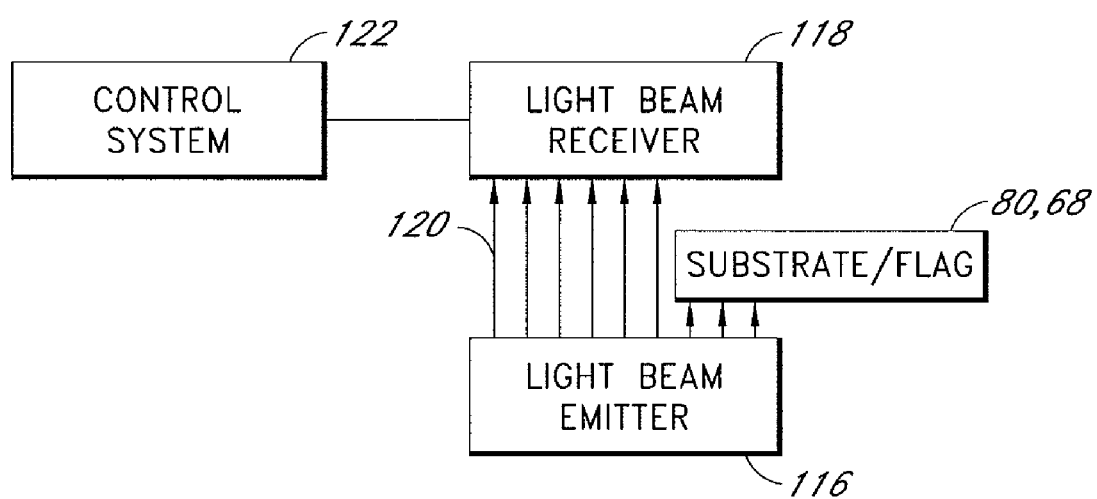
FIG. 8 is a schematic side view of a substrate or rear flag of an end effector partially impeding a light beam of a position photosensor, in accordance with an embodiment.

FIG. 8 is a schematic view of a position sensor 82 or 84 in accordance with one embodiment. Each position sensor 82, 84 is preferably a photosensor that comprises a light beam emitter 116 and a light beam receiver 118. In one embodiment, the emitter 116 of each sensor is positioned below the end effectors 42 (FIG. 4) of the robots 40 of the substrate handling chamber 102 (FIG. 3), and the receiver 118 of each sensor is positioned above the end effectors 42 and the emitter 116. For example, the emitter 116 can be mounted on a floor of the handling chamber 102, and the receiver can be mounted on a ceiling of the chamber 102. In other embodiments, the positions of the emitter 116 and receiver 118 can be reversed. The emitter 116 is preferably configured and oriented to emit a laser beam of light 120 toward the receiver 118, and the receiver is preferably configured to receive the light beam 120 from the emitter. In the illustrated embodiment, the emitter 116 upwardly emits the light beam 120 toward the receiver 118.

In an alternative embodiment, the ceiling and floor of the handling chamber 102 are transparent, and the emitter 116 and receiver 118 are positioned outside of the chamber 102. For example, the emitter 116 can be secured below the transparent floor of the handling chamber 102 and oriented to emit the light beam 120 through the floor into the chamber 102. Likewise, the receiver 118 can be secured above the transparent ceiling of the handling chamber 102 and positioned to receive the light beam 120 from the emitter 118.

With continued reference to FIG. 8, the emitted light beam 120 preferably has a ribbon-like shape. In FIG. 8, the vertical dimension of the light beam 120 is its length of travel, which is the distance between the emitter 116 and the receiver 118.

The horizontal dimension of the illustrated light beam 120 is one of the dimensions of its transverse cross section. The light beam 120 preferably has a transverse cross-section whose size and shape is uniform along the length of the beam. In use, the light beam 120 may be impeded by a substrate 80 held by an end effector 42 (FIG. 6), or by a rear flag 68 of an end effector. The receiver 118 produces a voltage that is characteristic of the amount of light that reaches the receiver. The voltage response is preferably linear and can be inversely proportional to the area of the light beam 120 that is blocked by the substrate 80 or rear flag 68. A control system 122 receives and uses the voltage signal from the receiver 118 to determine an amount of light received by the receiver 118 from its associated emitter 116. Based on the received amount of light, the control system 122 is able to estimate the position of the substrate, as explained below. The control system 122 preferably monitors each of the sensors 82 and 84 in this manner. Suitable proportionate photosensors 82 and 84 are available from companies such as Keyence Corp. of Japan, LMI of Canada, and Panasonic of Japan, and are often referred to as laser through beam sensor (LTBS) systems. In one embodiment, the apparatus 100 uses LX2-10 sensors produced by Keyence Corp., which have dimensions of 100 mm by 1 mm; however, this is only an example, and proportionate photosensors of different sizes may be employed.

As noted above, FIG. 6 shows an end effector 42 clamping the substrate 80 in a repeatable, expected position relative to the end effector. In other words, the substrate 80 has the same expected position with respect to the end effector 42 every time the substrate is picked up and held by the end effector. With reference to FIGS. 6-8, for a given pair of sensors 82 (e.g., the pair comprising sensors 82A and 82C, or the pair comprising sensors 82B and 82D), the positions of the sensors 82 and the length of each end effector 42 is preferably such that it is possible for the edge 86 of a substrate 80 held in the expected position by the end effector 42 to partially block a light beam 120 emitted from the emitter 116 of one of the position sensors 82, while the proximal end 48 of the end effector partially blocks a light beam 120 emitted from the emitter 116 of the other position sensor 82. As explained below, the control system 122 can use the light measurement voltage signals from the receivers 118 to make conclusions about the positions of the end effector 42 and the substrate 80 relative to the end effector.

Figure 9:
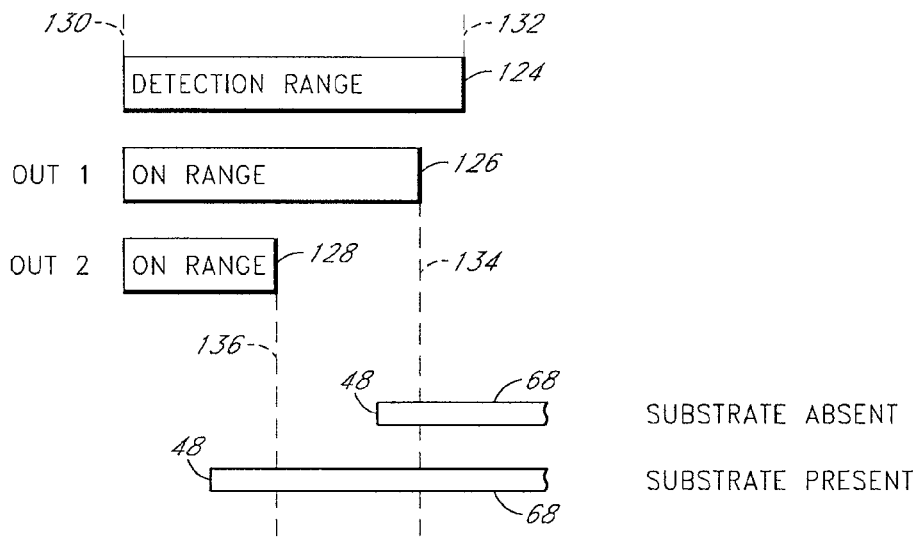
FIG. 9 is a schematic view of certain relationships between a light beam of a position photosensor and a proximal end of an end effector, in accordance with an embodiment.

FIG. 9 is a schematic view of certain relationships between a light beam 120 of a position photosensor 80, 82 and a proximal end 48 of an end effector 42 (FIG. 6), in accordance with an embodiment. FIG. 9 shows two example of end effector positions, each in an orientation in which the center 83 (FIG. 7) of the substrate handling chamber 102 is to the right of the illustrated end effector 42. In the illustrated embodiment, the end effector 42 has a rear flag 68 whose proximal end defines the proximal end 48 of the end effector. Box 124 represents a detection range of an emitter 116 of one of the sensors. In particular, the horizontal dimension of box 124 represents the length of a transverse cross-section of a light beam 120 emitted by the emitter 116. In FIG. 9, and with reference to a center 83 (FIG. 7) of the substrate handling chamber 102, the left end of the box 124 represents a radially outermost position 130 of the light beam 120, and the right end of the box 124 represents a radially innermost position 132 of the light beam. Box 126 represents a portion of the detection range, extending from the radial position 130 to a radial position 134 slightly radially outward from the radial position 132. Box 128 represents a smaller portion of the detection range, extending from the radial position 130 to a radial position 136 between the radial positions 130 and 134.

The symbol OUT1 is preferably a logically determined digital output whose value is based upon the presence or absence of an item blocking the light beam in the portion of the detection range represented by box 126. This output can have two possible values, which are referred to herein as ON and OFF. In particular, when an item such as a rear flag 68 of an end effector 42 or, as discussed below in connection with FIG. 10, a substrate 80 impedes part of the light beam in the portion of the detection range represented by box 126, then OUT1 is ON. On the other hand, if nothing impedes the light beam in the detection range represented by box 126, then OUT1 is OFF. Likewise, the symbol OUT2 is preferably a logically determined digital output whose value is based upon the presence or absence of an item blocking the light beam in the portion of the detection range represented by box 128. Like OUT1, OUT2 can have two possible values, which are also referred to herein as ON and OFF. When an item such as a rear flag 68 or a substrate 80 impedes part of the light beam in the portion of the detection range represented by box 128, then OUT2 is ON. On the other hand, if nothing impedes the light beam in the detection range represented by box 128, then OUT2 is OFF. It will be appreciated that the outputs OUT1 and OUT2 can be computed from measuring the amount of received/blocked light associated with each sensor, and are not necessarily inherent characteristics of the sensors themselves. An advantage of this is that the system can employ commercially available sensors, which do not need to be physically modified for the presently disclosed purposes.

It will be understood that the values of OUT1 and OUT2 can be determined simply by measuring the total amount of light received by a sensor's receiver 118. If the total amount of light received is equal to the amount of light emitted by the emitter 116, then the light beam is completely unimpeded and both OUT1 and OUT2 are set to OFF. If the total amount of light received is less than the amount emitted from the emitter 116, but more than a predetermined threshold that is known to be received when the edge of the blocking item (e.g., the flag 68 or substrate 80) is at radial position 136, then OUT1 is set to ON and OUT2 is set to OFF. In FIG. 9, this corresponds to the upper example in which the proximal end 48 of the flag 68 is between the radial positions 134 and 136. If the total amount of light received is less than said predetermined threshold, then both OUT1 and OUT2 are set to ON. This corresponds to the lower example in FIG. 9 in which the proximal end 48 of the flag 68 is radially outward of the position 136. In a preferred embodiment, the control system 122 (FIG. 8) runs software that computes the values of OUT1 and OUT2 based on the voltage signal from the receiver 118.

Figure 10:
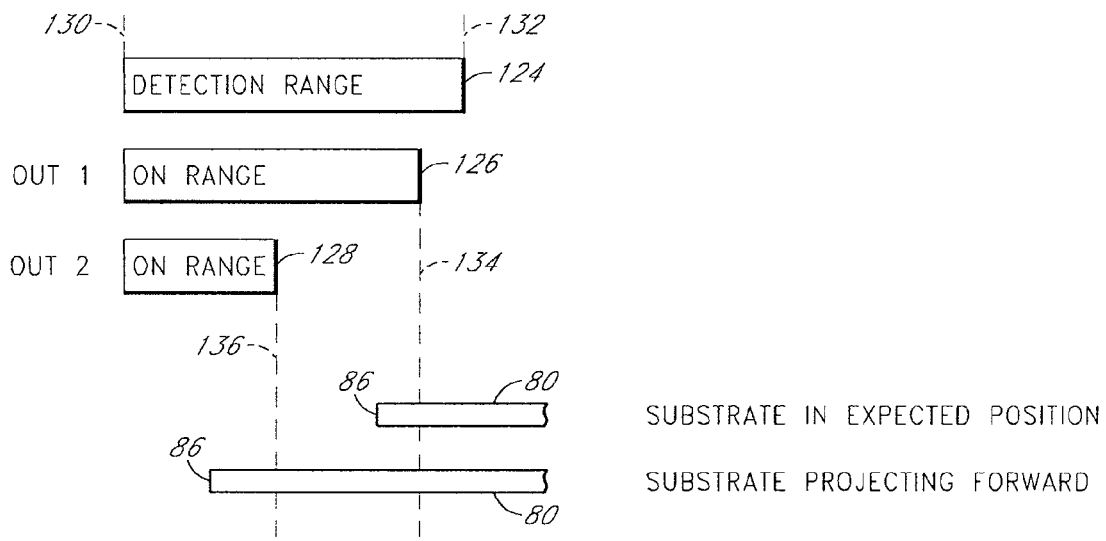
FIG. 10 is a schematic view of certain relationships between a light beam of a position photosensor and a substrate held at a distal end of an end effector, in accordance with an embodiment.

FIG. 10 is a schematic view of certain relationships between the light beam of the position photosensor 80, 82 and an edge 86 of a substrate 80 held at the distal end 46 (FIG. 4) of an end effector 42, in accordance with an embodiment. Like FIG. 9, FIG. 10 shows two examples of substrate positions, each in an orientation in which the center 83 (FIG. 7) of the substrate handling chamber 102 is to the right of the illustrated substrate 80. This photosensor can be a sensor on an opposing side of the photosensor of FIG. 9, illustrating conditions on the opposite end of the same end effector 42. Alternatively, this photosensor can be the same as that of FIG. 9, illustrating conditions with the end effector 42 rotated 180° abut a vertical axis at center 83 of the substrate handling chamber 102. Alternatively, this photosensor can be any one of the other photosensors 82, 84.

As in FIG. 9, it will be understood that the values of OUT1 and OUT2 in FIG. 10 can be determined simply by measuring the total amount of light received by a sensor's receiver 118. If the total amount of light received is equal to the amount of light emitted by the emitter 116, then the light beam is completely unimpeded and both OUT1 and OUT2 are set to OFF. If the total amount of light received is less than the amount emitted from the emitter 116, but more than a predetermined threshold that is known to be received when the edge 86 of the substrate 80 is at radial position 136, then OUT1 is set to ON and OUT2 is set to OFF. In FIG. 10, this corresponds to the upper example in which the edge 86 of the substrate 80 at the distal end 46 (FIG. 4) of the end effector 42 is between the radial positions 134 and 136. If the total amount of light received is less than said predetermined threshold, then both OUT1 and OUT2 are set to ON. This corresponds to the lower example in FIG. 10 in which the substrate edge 86 is radially outward of the position 136. In a preferred embodiment, the control system 122 (FIG. 8) runs software to compute the values of OUT1 and OUT2 based on the voltage signal from the receiver 118.

With reference to FIGS. 6-8, the control system 122 is preferably configured to instruct the robots 40 to move their end effectors 42 to predefined target positions in which the end effectors are suitably positioned for advancement into the processing chambers 104 through the ports 108, or to predefined target positions in which the end effectors are suitably positioned for advancement into the input/output chambers 106 through the ports 112. With specific reference to FIG. 7, the target positions are preferably characterized by the end effectors 42 being oriented along the dotted lines passing through the center 83 of the substrate handling chamber 102.

With reference to FIGS. 6, 8, and 9, suppose that the control system 122 instructs the robot 40 to move an end effector 42 to a predefined target position while holding a substrate 80. Each target position is preferably defined such that if the substrate 80 is properly held in the expected position relative to the end effector 42, then the proximal end 48 of the end effector (which in the illustrated embodiment is defined by the rear flag 68), is positioned as shown in the lower example of FIG. 9. In other words, the flag 68 blocks enough of the light beam 120 of the rear position sensor 82 to turn ON both OUT1 and OUT2. Thus, the control system 122 is preferably configured to interpret a condition in which the proximal sensor 82 has ON values for both OUT1 and OUT2 to mean that the end effector 42 is in the target position and is holding a substrate 80 in the expected position relative to the end effector.

On the other hand, the control system 122 is preferably configured to interpret a condition in which the proximal sensor 82 has an ON value for OUT1 and an OFF value for OUT2 to mean that the end effector 42 is in the target position but is not holding a substrate 80. This is because the absence of a substrate 80 on the paddle 50 causes the proximal clamping member 52 to advance too far as it moves forward to clamp onto a substrate. In other words, a substrate 80 is not present to halt the forward motion of the clamping member 52. As a result, the proximal end 48 of the end effector 42 moves to a position such as the upper example in FIG. 9 (in which the forward direction is to the right). In this position, the rear flag 68 only blocks enough of the light beam 120 to turn ON OUT1 but not OUT2. In one embodiment, the distance between positions of the proximal end 48 of the end effector 42 in the upper and lower examples of FIG. 9 is about 2 mm.

In a third possibility, the control system 122 is preferably configured to interpret a condition in which the proximal sensor 82 has OFF values for both OUT1 and OUT2 to mean that the end effector 42 is not in the target position. This is because the target position is preferably defined relative to the proximal sensor 82 so that at least a portion of the light beam 120 will be blocked by the rear flag 68 of the end effector 42, regardless of whether or not the end effector holds a substrate. Thus, if the light beam is completely unimpeded, then the system preferably concludes that the end effector 42 has not reached the target position. For example, mechanical, electrical, or other problems might prevent the end effector 42 from reaching the target position, despite being instructed to be moved there by the control system 122. Table 1 summarizes the three possible control system conclusions associated with the rear position sensor 82 of a particular end effector 42 that has been instructed to move into a target position.

TABLE 1

| OUT1 | OUT2 | CONCLUSION |
| --- | --- | --- |
| ON | ON | Substrate present in expected position |
| ON | OFF | Substrate absent |
| OFF | OFF | End effector not in target position |

Now consider the forward position sensor 82. With reference to FIGS. 6, 8, and 10, suppose again that the control system 122 instructs the robot 40 to move an end effector 42 to a predefined target position while holding a substrate 80. Each target position is preferably defined such that if the substrate 80 is properly held in the expected position relative to the end effector 42, then the forward edge 86 of the substrate 80 is positioned as shown in the upper example of FIG. 10 (in which the forward direction is to the left). In other words, the substrate 80 blocks enough of the light beam 120 of the forward position sensor 82 to turn ON OUT1 but not OUT2. Thus, the control system 122 is preferably configured to interpret a condition in which the forward sensor 82 has an ON value for OUT1 and an OFF value for OUT2 to mean that the end effector 42 is holding a substrate 80 in the expected position relative to the end effector.

On the other hand, the control system 122 is preferably configured to interpret a condition in which the forward sensor 82 has ON values for both OUT1 and OUT2 to mean that the substrate 80 is projecting distally beyond the expected position of the substrate relative to the end effector. This corresponds to the lower example of FIG. 10. This might occur if the forward portion of the substrate 80 is resting upon the clamping elements 54 (FIG. 4) of the paddle 50, as opposed to the intended condition in which the clamping elements 54 engage the substrate edge 86. In this position, the substrate 80 blocks enough of the light beam 120 to turn ON both OUT1 and OUT2.

It should be noted that if the forward position sensor 82 has ON values for both OUT1 and OUT2 (lower example of FIG. 10), and if the rear position sensor 82 simultaneously has an ON value for OUT1 and an OFF value for OUT 2 (upper example of FIG. 9), the control system 122 preferably concludes that the substrate 80 is projecting distally beyond its expected position. In other words, in this case the conclusion based on the front position sensor 82 should override the conclusion based on the rear position sensor 82. This is because if the substrate 80 is projecting forward beyond its expected position, the proximal clamping member 52 will still move forward too far. If a portion of the light beam 120 of the forward position sensor 82 is blocked, it would be erroneous to conclude that a substrate 80 is absent.

In a third possibility, the control system 122 is preferably configured to interpret a condition in which the forward sensor 82 has OFF values for both OUT1 and OUT2 to mean that the substrate 80 is absent. This is because the target position is preferably defined relative to the forward sensor 82 so that at least a portion of the light beam 120 will be blocked by the substrate 80 if the substrate is present. It should be noted that the conclusion that the substrate 80 is absent is preferably made only if the rear sensor 82 simultaneously indicates that the end effector 42 is in the target position. If the end effector 42 is not in the target position, the fact that the light beam of the forward sensor 82 is not blocked does not necessarily mean that the substrate is absent. Table 2 summarizes the three possible control system conclusions associated with the front position sensor 82.

TABLE 2

| OUT1 | OUT2 | CONCLUSION |
|---|---|---|
| ON | ON | Substrate projecting forward beyond expected position |
| ON | OFF | Substrate is in expected position |
| OFF | OFF | Substrate absent |

In the preceding paragraphs, the terms "front sensor" and "rear sensor" are used to refer to the sensors at the distal and proximal ends, respectively, of the end effector 42. It will be understood that the front sensor can become the rear sensor if the end effector 42 is rotated 180° about a vertical axis at the center 83 (FIG. 7) of the substrate handling chamber 102.

Figure 11:
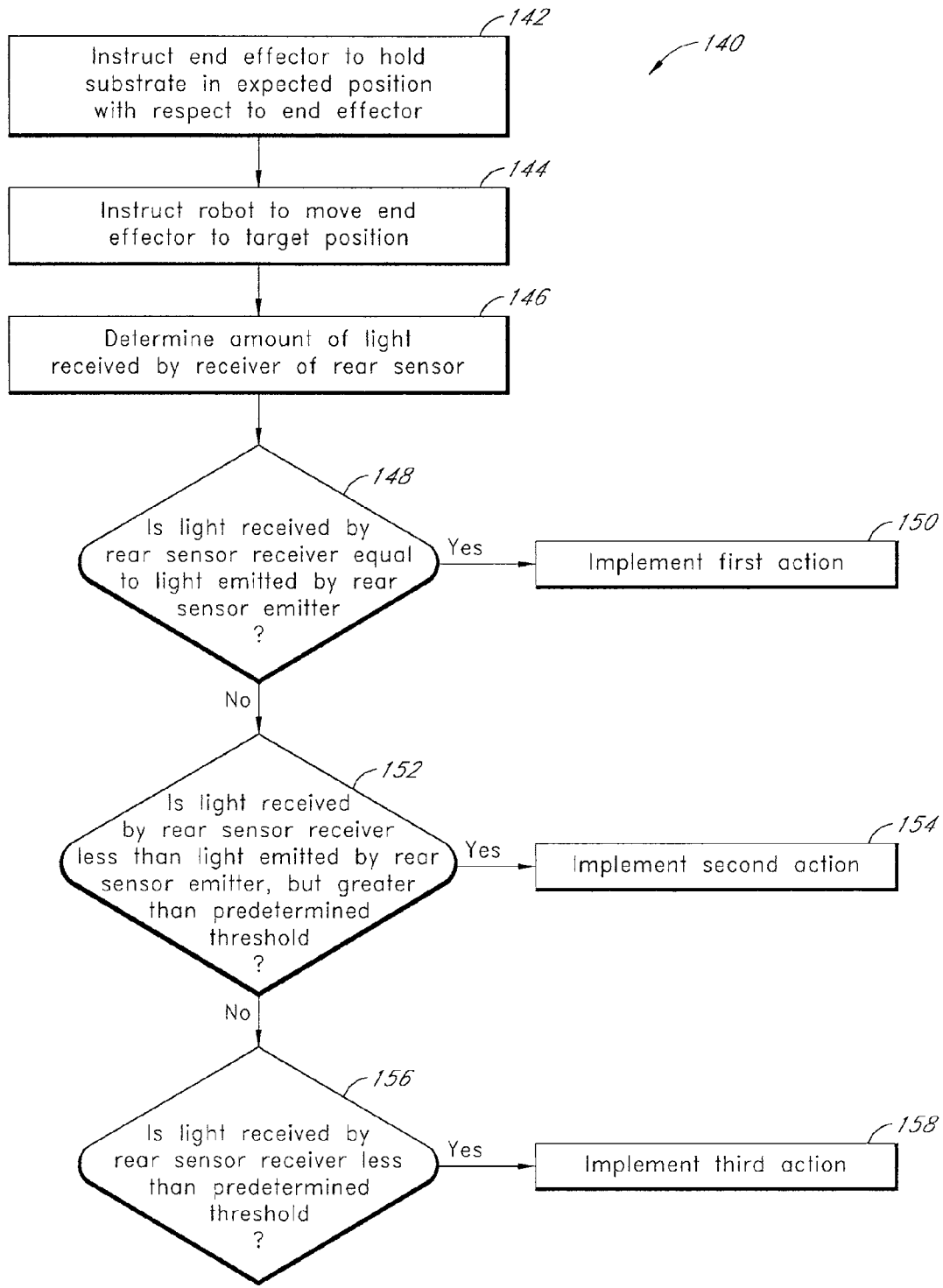
FIG. 11 is a flowchart illustrating a method of processing an output of a position sensor at the rear of an end effector.

FIG. 11 illustrates a method 140 by which the control system 122 (FIG. 8) processes readings from a position sensor 82 at the rear of an end effector 42 (FIG. 6). The control system 122 is preferably programmed to conduct the steps shown in FIG. 11. In a step 142, the control system 122 instructs the end effector 42 to hold a substrate 80 in the expected position of the substrate relative to the end effector. In a step 144, the control system 122 instructs the robot 40 to move the end effector 42 to a predefined target position while holding the substrate 80 in the expected position. As noted above, the target position of the end effector 42 is preferably such that the distal end 46 of the end effector 42 is near a first one of a pair of sensors 82 and the proximal end 48 of the end effector is near a second one of the pair of sensors 82.

In a step 146, the control system 122 determines an amount of light received by the receiver 118 of the second sensor 82 from the emitter 116 of the second sensor. In a step 148, the control system 122 determines whether the received amount of light is equal to an amount of light emitted by the emitter 116 of the second sensor 82. If so, the control system 122 concludes that the end effector 42 is not in the target position and, in a step 150, implements a first action. For example, the first action might be to attempt to move the end effector 42 into the target position. If the answer in step 148 is no, then the control system 122 determines, in a step 152, whether the received amount of light is less than the amount of light emitted by the emitter 116 of the second sensor 82 but greater than a predetermined threshold. If so, the control system 122 concludes that the end effector 42 is in the target position but is not holding a substrate 80. The control system 122 then proceeds to implement a second action in a step 154. For example, the second action might be to instruct the end effector 42 to pickup another substrate 80. If the answer in step 152 is no, then the control system 122 determines, in a step 156, whether the received amount of light is less than the threshold. If so, the control system 122 concludes that the end effector 42 is in the target position and is holding a substrate 80 in the expected position. The control system 122 then proceeds to implement a third action in a step 158. For example, the third action might be to instruct the robot 40 to proceed with a given process recipe. Preferably, the first, second, and third actions of the method 140 are different from each other.

Figure 12:
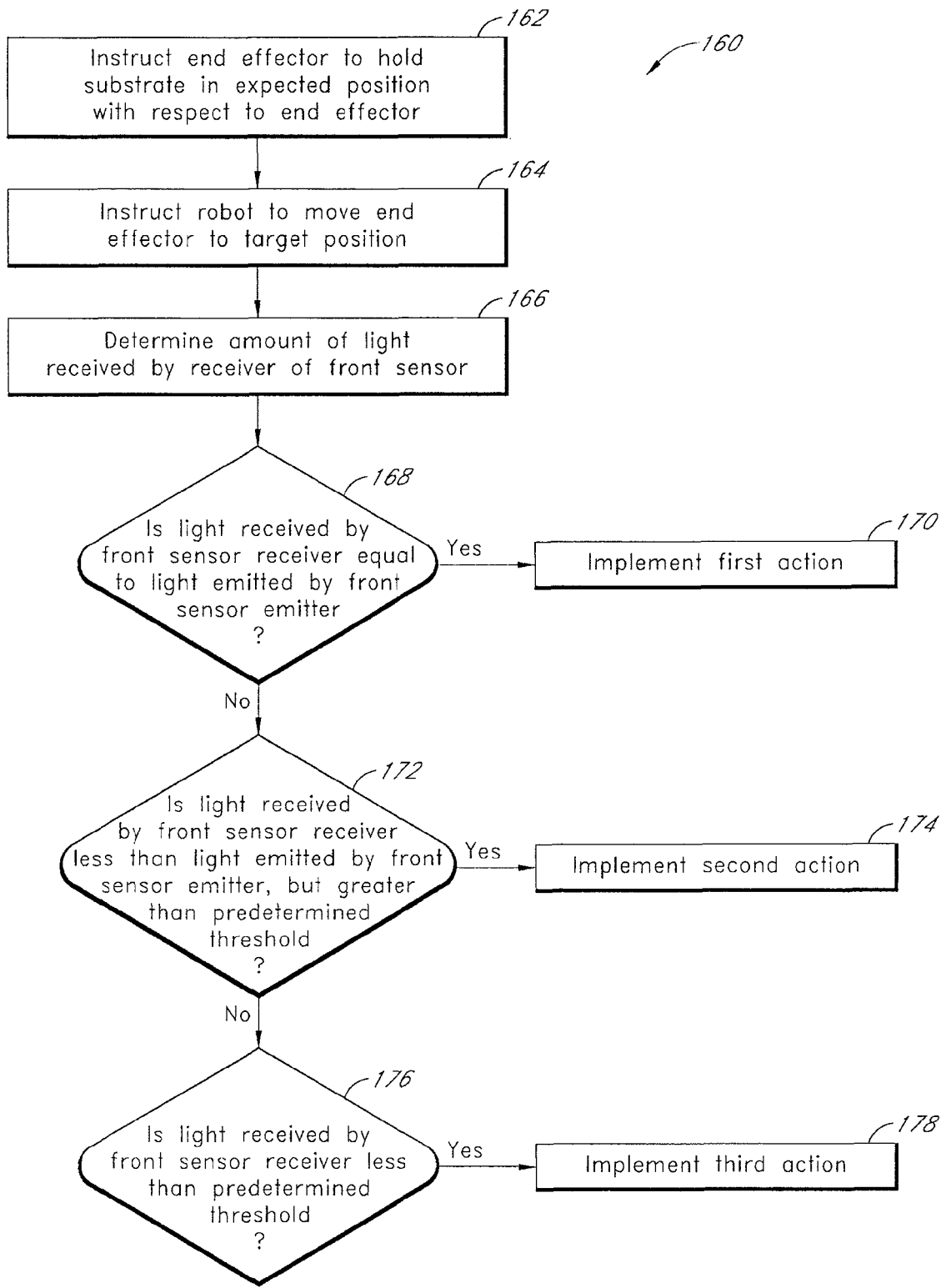
FIG. 12 is a flowchart illustrating a method of processing an output of a position sensor forward of an end effector.

FIG. 12 illustrates a method 160 by which the control system 122 processes readings from a position sensor 82 at the front end of an end effector 42. The control system 122 is preferably programmed to conduct the steps shown in FIG. 12. In a step 162, the control system 122 instructs the end effector 42 to hold a substrate 80 in the expected position of the substrate relative to the end effector. In a step 164, the control system 122 instructs the robot 40 to move the end effector 42 to a predefined target position while holding the substrate 80 in the expected position. As noted above, the target position of the end effector 42 is preferably such that the distal end 46 of the end effector 42 is near a first one of a pair of sensors 82 and the proximal end 48 of the end effector is near a second one of the pair of sensors 82.

In a step 166, the control system 122 determines an amount of light received by the receiver 118 of the first sensor 82 from the emitter 116 of the first sensor. In a step 168, the control system 122 determines whether the received amount of light is equal to an amount of light emitted by the emitter 116 of the first sensor 82. If so, the control system 122 concludes that the end effector 42 is not holding a substrate 80, assuming that the rear sensor 82 indicates that the end effector is in the target position. Then, in a step 170, the control system 122 implements a first action, such as instructing the end effector 42 to pickup another substrate 80. If the answer in step 168 is no, then the control system 122 determines, in a step 172, whether the received amount of light is less than the amount of light emitted by the emitter 116 of the first sensor 82 but greater than a predetermined threshold. If so, the control system 122 concludes that the end effector 42 is holding a substrate 80 in the expected position. The control system 122 then proceeds to implement a second action in a step 174. For example, the second action might be to instruct the robot 40 to proceed with a given process recipe. If the answer in step 172 is no, then the control system 122 determines, in a step 176, whether the received amount of light is less than the threshold. If so, the control system 122 concludes that the substrate 80 is projecting distally beyond the expected position of the substrate. The control system 122 then proceeds to implement a third action in a step 178. For example, the third action might be to attempt to move the substrate 80 rearward into the expected position. Preferably, the first, second, and third actions of the method 160 are different from each other.

With reference to FIG. 7, the input/output sensors 84 can also be used to detect conditions associated with the robots 40 when the end effectors 42 occupy predefined target positions in which the distal ends 46 (FIG. 4) of the end effectors are oriented toward the input/output ports 112. In particular, as described above in connection with FIG. 9, the position sensors 84 can be used to detect whether the end effector 42 is in the target position and whether the end effector is holding a substrate 80 in the expected position. Accordingly, the control system 122 may be programmed to instruct the robot 40 to move the end effector 42 to a target position while holding the substrate 80 in the expected position. The target position is such that the proximal end 48 of the end effector 42 is near an input/output sensor 84, the end effector is substantially aligned with the input/output sensor 84 and an input/output port 112, and the distal end 46 of the end effector points toward the input/output port 112. Further, the control system 122 can be programmed to then determine an amount of light received by the receiver 118 of the input/output sensor 84 from the emitter 116 of the input/output sensor. If the received amount of light is equal to an amount of light emitted by the emitter 116 of the input/output sensor 84, the control system 122 can be programmed to implement a first action based on a conclusion that the end effector 42 is not in the target position. For example, the first action can be an attempt to move the end effector 42 into the target position. If the received amount of light is less than the amount of light emitted by the emitter 116 of the input/output sensor 84 but greater than a predetermined threshold, the control system 122 can be programmed to implement a second action based on a conclusion that the end effector 42 is in the target position but is not holding a substrate 80. For example, the second action can be to instruct the robot 40 to proceed with a given process recipe. Finally, if the received amount of light is less than the threshold, the control system 122 can be programmed to implement a third action based on a conclusion that the end effector 42 is in the target position and is holding a substrate 80 in the expected position. For example, the third action can be to instruct the end effector 42 to pickup another substrate 80.

FIG. 13 illustrates an example sequence of certain operational steps performed by a pair of wafer transfer robots 1 and 2 within an illustrated wafer handling chamber, in accordance with an embodiment. In particular, FIG. 13 illustrates steps in which a first semiconductor wafer is retrieved from an input/output chamber or processing chamber (collectively referred to herein as an adjacent chamber) using one robot, and then a second wafer is placed into the adjacent chamber using the other robot. The handling chamber also includes left and right position photosensors as described above. In FIG. 13, the adjacent chamber is to the right of the right photosensor. The robot 1 is a lower robot, and the robot 2 is an upper robot positioned thereabove.

The sequence of FIG. 13 begins in a wafer retrieval standby step A, in which the upper robot 2 holds the second wafer while the lower robot 1 is standing by to retrieve the first wafer from the adjacent chamber. In this condition, the proximal end of the robot 1 partially shields the left photosensor, while the right photosensor is not shielded due to the absence of a wafer on the robot 1. In this position, the left photosensor can be used to confirm that the end effector of robot 1 is in the target position and is not currently holding a wafer. Next, in a wafer retrieval start step B, the lower robot 1 extends to pick up the first wafer from the adjacent chamber. Next, in a wafer retrieval step C, the lower robot picks up the first wafer from a station inside the adjacent chamber. Next, in a wafer retrieval completion step D, the lower robot 1 returns to its original position while holding the first wafer. In this condition, both photosensors are shielded. The left photosensor can be used to confirm that the end effector of robot 1 is in the target position and is currently holding the first wafer in the expected position of the end effector. The right photosensor can also be used to confirm that the first wafer is in the expected position.

Next, in a wafer placement standby step E, the robots 1 and 2 are both rotated about a vertical center axis of the wafer handling chamber, such that the end effector of the upper robot 2 is moved to the target position associated with the adjacent chamber. In this condition, both photosensors are shielded. The left photosensor can be used to confirm that the end effector of robot 2 is in the target position and is currently holding the second wafer in the expected position of the end effector. The right photosensor can also be used to confirm that the second wafer is in the expected position. Next, in a wafer placement start step F, the robot 2 extends to transfer the second wafer to the adjacent chamber. Next, in a wafer placement step G, the robot 2 places the wafer at a station inside the adjacent chamber. Finally, in a wafer placement completion step H, the end effector of the robot 2 returns to the aforementioned target position associated with the adjacent chamber. In this condition, the left photosensor is shielded and the right photosensor is not shielded. In this condition, the left photosensor can be used to confirm that the end effector of the robot 2 is in the target position and is not currently holding a wafer. The right photosensor can also be used to confirm that the end effector of the robot 2 is not holding a wafer.

FIG. 13 illustrates an example sequence of certain operational steps performed by a pair of wafer transfer robots. However, it will also be appreciated that a similar procedure can be used with three or more robots.

With reference to FIG. 7, in order to reduce the total number of sensors used by the semiconductor processing apparatus 100, the photosensors 82 can also be used as obstacle detectors for the gate valves 110 between the processing chambers 104 and the substrate handling chamber 102. If a wafer is detected by a photosensor 82 in a position where it could be pinched by a closing gate valve 110, the gate valve 110 is maintained in an open position. This multifunctionality of the sensors 82 can advantageously reduce the overall cost by reducing the number of required sensors. Similarly, two sensors 85 can act as obstacle detectors for the gate valves 114 between the input/output chambers 106 and the handling chamber 102.

Compared to previous position sensing systems, such as the one shown in FIGS. 1 and 2, the systems of the present application employ fewer position sensors, thereby reducing the equipment costs. The conventional handling chamber 12 of FIGS. 1 and 2 includes nine position sensors for sensing wafer positions during the transfer of wafers among six different adjacent chambers (processing chambers 14, load lock chambers 16, and cooling chambers 18). In comparison, the substrate handling chamber 102 of FIG. 7 includes only six position sensors for sensing substrate positions during the transfer of substrates among six different adjacent chambers (the processing chambers 104 and the input/output chambers 106).

Although this invention has been disclosed in the context of certain preferred embodiments and examples, it will be understood by those skilled in the art that the present invention extends beyond the specifically disclosed embodiments to other alternative embodiments and/or uses of the invention and obvious modification thereof. Thus, it is intended that the scope of the present invention herein disclosed should not be limited by the particular disclosed embodiments described above, but should be determined only by a fair reading of the claims that follow.

What is claimed is:

1. A semiconductor substrate processing apparatus, comprising:
    a substrate handling chamber;
    a first pair of position sensors each comprising:
        a light beam emitter configured to emit a beam of light; and
        a receiver configured to receive the light beam; and
    a substrate transfer robot within the handling chamber, the robot comprising:
        an elongated end effector having a distal end and a proximal end, the end effector configured to pick up and hold a semiconductor substrate at the distal end such that the substrate has a same expected position with respect to the end effector every time the substrate is picked up and held by the end effector; and
        a robot actuator configured to move the end effector within the handling chamber to transfer substrates among a plurality of substrate stations;
    wherein the end effector has a length such that it is possible for an edge of a substrate held in the expected position by the end effector to partially block a light beam emitted from the emitter of one of the position sensors, while the proximal end of the end effector partially blocks a light beam emitted from the emitter of the other position sensor.

2. The apparatus of claim 1, wherein the light beam emitter of each sensor is positioned below the end effector and is configured to upwardly emit its beam of light, the receiver of each sensor being above the emitter of the sensor and the end effector.

3. The apparatus of claim 1, further comprising a pair of ports each between the substrate handling chamber and one of two adjacent chambers, each adjacent chamber comprising one of a processing chamber and a load lock chamber, wherein each of the sensors is positioned by one of the ports, each port being sized to allow the end effector to pass through the port while the end effector is holding a substrate in the expected position.

4. The apparatus of claim 1, further comprising:
a first pair of processing chambers each adjacent to the substrate handling chamber;
a first pair of processing chamber ports each between the handling chamber and one of the processing chambers of the first pair of processing chambers, wherein each sensor of said first pair of sensors is positioned by one of the processing chamber ports of the first pair of processing chamber ports;
a second pair of processing chambers each adjacent to the substrate handling chamber;
a second pair of processing chamber ports each between the handling chamber and one of the processing chambers of the second pair of processing chambers; and
a second pair of position sensors within the handling chamber, each sensor of the second pair of sensors comprising:
a light beam emitter configured to emit a beam of light; and
a receiver configured to receive the light beam;
wherein the sensors of the second pair of sensors are positioned so that it is possible for an edge of a substrate held in the expected position by the end effector to partially block a light beam emitted from the emitter of one of the sensors of the second pair of sensors, while the proximal end of the end effector partially blocks a light beam emitted from the emitter of the other sensor of the second pair of sensors, each of the sensors of the second pair of sensors being positioned by one of the processing chamber ports of the second pair of processing chamber ports, each of the processing chamber ports of the first and second pairs of processing chamber ports being sized to allow the end effector to pass through the processing chamber port while the end effector is holding a substrate in the expected position.

5. The apparatus of claim 1, further comprising a control system programmed to determine, for each of the sensors, an amount of light received by the receiver of the sensor from the emitter of the sensor.

6. The apparatus of claim 1, further comprising a control system programmed to:
(a) instruct the end effector to hold a substrate in the expected position;
(b) instruct the robot to move the end effector to a target position while holding the substrate in the expected position, wherein the target position of the end effector is such that the distal end of the end effector is near a first sensor of the pair of sensors and the proximal end of the end effector is near a second sensor of the pair of sensors;
(c) determine an amount of light received by the receiver of the first sensor from the emitter of the first sensor when the control system has instructed the end effector to hold a substrate in the expected position and has instructed the robot to move the end effector to the target position while holding the substrate in the expected position;
(d) implement a first end effector action if said received amount of light is equal to an amount of light emitted by the emitter of the first sensor;
(e) implement a second end effector action if said received amount of light is less than the amount of light emitted by the emitter of the first sensor but greater than a predetermined threshold; and
(f) implement a third end effector action if said received amount of light is less than said threshold;
wherein the first, second, and third actions are different.

7. The apparatus of claim 6, wherein the first action is based on a conclusion that the end effector is not holding a substrate, the second action is based on a conclusion that the end effector is holding a substrate in the expected position, and the third action is based on a conclusion that the substrate is projecting distally beyond the expected position of the substrate.

8. The apparatus of claim 1, further comprising a control system programmed to:
(a) instruct the end effector to hold a substrate in the expected position;
(b) instruct the robot to move the end effector to a target position while holding the substrate in the expected position, wherein the target position of the end effector is such that the distal end of the end effector is near a first sensor of the pair of sensors and the proximal end of the end effector is near a second sensor of the pair of sensors;
(c) determine an amount of light received by the receiver of the second sensor from the emitter of the second sensor when the control system has instructed the end effector to hold a substrate in the expected position and has instructed the robot to move the end effector to the target position while holding the substrate in the expected position;
(d) implement a first end effector action if said received amount of light is equal to an amount of light emitted by the emitter of the second sensor;
(e) implement a second end effector action if said received amount of light is less than the amount of light emitted by the emitter of the second sensor but greater than a predetermined threshold; and
(f) implement a third end effector action if said received amount of light is less than said threshold;
wherein the first, second, and third actions are different.

9. The apparatus of claim 8, wherein the first action is based on a conclusion that the end effector is not in the target position, the second action is based on a conclusion that the end effector is in the target position but is not holding a substrate, and the third action is based on a conclusion that the end effector is in the target position and is holding a substrate in the expected position.

10. The apparatus of claim 1, further comprising:
a substrate input/output chamber adjacent to the handling chamber;
an input/output port between the handling chamber and the input/output chamber, the input/output port being sized to allow the end effector to pass through the input/output port while the end effector is holding a substrate in the expected position;

an input/output position sensor positioned on a side of the handling chamber opposite the input/output port, the input/output sensor comprising:
  a light beam emitter configured to emit a beam of light; and
  a receiver configured to receive the light beam; and
a control system programmed to:
  (a) instruct the end effector to hold a substrate in the expected position;
  (b) instruct the robot to move the end effector to a target position while holding the substrate in the expected position, wherein the target position of the end effector is such that the proximal end of the end effector is near the input/output sensor, the end effector is substantially aligned with the input/output sensor and the input/output port, and the distal end of the end effector points toward the input/output port;
  (c) determine an amount of light received by the receiver of the input/output sensor from the emitter of the input/output sensor when the control system has instructed the end effector to hold a substrate in the expected position and has instructed the robot to move the end effector to the target position while holding the substrate in the expected position;
  (d) implement a first end effector action if said received amount of light is equal to an amount of light emitted by the emitter of the input/output sensor;
  (e) implement a second end effector action if said received amount of light is less than the amount of light emitted by the emitter of the intput/output sensor but greater than a predetermined threshold; and
  (f) implement a third end effector action if said received amount of light is less than said threshold;
wherein the first, second, and third actions are different.

11. The apparatus of claim 1, wherein the end effector comprises:
  a paddle configured to underlie and support a substrate, the paddle having a distal end defining the distal end of the end effector, the paddle having one or more forward clamping elements configured to clamp against an edge of a substrate held by the end effector; and
  a proximal clamping member having one or more clamping elements configured to clamp against an edge of a substrate held by the end effector, the proximal clamping member being configured to move toward and away from the distal end of the end effector to clamp or unclamp a substrate between the clamping elements of the paddle and the clamping elements of the proximal clamping member, wherein said movement of the proximal clamping member with respect to the distal end of the end effector varies a position of the proximal end of the end effector with respect to the distal end of the end effector.

12. The apparatus of claim 1, further comprising a second substrate transfer robot within the substrate handling chamber, the second robot comprising:
  a second elongated end effector having a distal end and a proximal end, the second end effector configured to pick up and hold a semiconductor substrate at the distal end of the second end effector such that the substrate has a same expected position with respect to the second end effector every time the substrate is picked up and held by the second end effector; and
  a second robot actuator configured to move the second end effector within the handling chamber to transfer substrates among the plurality of substrate stations;
  wherein the second end effector has a length such that it is possible for an edge of a substrate held by the second end effector in the expected position to partially block a light beam emitted from the emitter of one of the position sensors, while the proximal end of the second end effector partially blocks a light beam emitted from the emitter of the other position sensor.

13. The apparatus of claim 1, wherein the sensors are both positioned at an outer periphery of the handling chamber such that at least one of the sensors can detect an obstacle in a gate valve between the substrate handling chamber and an adjacent chamber.

14. A method of controlling a semiconductor substrate transfer robot, comprising:
  providing a first pair of position sensors, each sensor comprising a light beam emitter and a receiver, the emitter configured to emit a beam of light, the receiver configured to receive the light beam from the emitter;
  providing a substrate transfer robot within a substrate handling chamber, the robot comprising an elongated end effector and a robot actuator, the end effector having a distal end and a proximal end, the end effector configured to pick up and hold a semiconductor substrate at the distal end such that the substrate has a same expected position with respect to the end effector every time the substrate is picked up and held by the end effector, the robot actuator configured to move the end effector within the handling chamber to transfer substrates among a plurality of substrate stations, wherein the end effector has a length such that it is possible for an edge of a substrate held in the expected position by the end effector to partially block a light beam emitted from the emitter of one of the position sensors, while the proximal end of the end effector partially blocks a light beam emitted from the emitter of the other position sensors;
  instructing the end effector to hold a substrate in the expected position with respect to the end effector;
  instructing the robot to move the end effector to a target position while holding the substrate in the expected position with respect to the end effector, wherein the target position of the end effector is such that the distal end of the end effector is near a first sensor of the pair of sensors and the proximal end of the end effector is near a second sensor of the pair of sensors;
  after said instructing steps, determining one or both of (1) an amount of light received by the receiver of the first sensor from the emitter of the first sensor, and (2) an amount of light received by the receiver of the second sensor from the emitter of the second sensor; and
  controlling the robot based on said determining.

15. The method of claim 14, further comprising:
  providing two chambers adjacent to the substrate handling chamber, each of the adjacent chambers comprising one of a processing chamber and a load lock chamber; and
  providing a pair of ports each between the substrate handling chamber and one of the adjacent chambers, each port being sized to allow the end effector to pass through the port while the end effector is holding a substrate in the expected position;
  wherein providing the pair of sensors comprises positioning each of the sensors by one of the ports.

16. The method of claim 14, further comprising:
  providing a first pair of processing chambers each adjacent to the substrate handling chamber;

providing a first pair of processing chamber ports each between the handling chamber and one of the processing chambers of the first pair of processing chambers, wherein each sensor of said first pair of sensors is positioned by one of the processing chamber ports of the first pair of processing chamber ports;

providing a second pair of processing chambers each adjacent to the substrate handling chamber;

providing a second pair of processing chamber ports each between the handling chamber and one of the processing chambers of the second pair of processing chambers;

providing a second pair of position sensors within the handling chamber, each sensor of the second pair of sensors comprising:
   a light beam emitter configured to emit a beam of light; and
   a receiver configured to receive the light beam;

positioning the sensors of the second pair of sensors so that it is possible for an edge of a substrate held in the expected position by the end effector to partially block a light beam emitted from the emitter of one of the sensors of the second pair of sensors, while the proximal end of the end effector partially blocks a light beam emitted from the emitter of the other sensor of the second pair of sensors; and positioning each of the sensors of the second pair of sensors by one of the processing chamber ports of the second pair of processing chamber ports, wherein each of the processing chamber ports of the first and second pairs of processing chamber ports is sized to allow the end effector to pass through the processing chamber port while the end effector is holding a substrate in the expected position.

17. The method of claim 14, further comprising:
determining, for each of the sensors, an amount of light received by the receiver of the sensor from the emitter of the sensor.

18. The method of claim 14:
wherein said determining comprises determining an amount of light received by the receiver of the first sensor from the emitter of the first sensor when the end effector has been instructed to hold a substrate in the expected position and when the robot has been instructed to move the end effector to the target position while holding the substrate in the expected position, wherein the method further comprises:

implementing a first end effector action if said amount of light received by the receiver of the first sensor is equal to an amount of light emitted by the emitter of the first sensor;

implementing a second end effector action if said amount of light received by the receiver of the first sensor is less than the amount of light emitted by the emitter of the first sensor but greater than a predetermined threshold; and implementing a third end effector action if said amount of light received by the receiver of the first sensor is less than said threshold;

wherein the first, second, and third actions are different.

19. The method of claim 18, wherein the first action is based on a conclusion that the end effector is not holding a substrate, the second action is based on a conclusion that the end effector is holding a substrate in the expected position, and the third action is based on a conclusion that the substrate is projecting distally beyond the expected position of the substrate.

20. The method of claim 18:
wherein said determining comprises determining an amount of light received by the receiver of the second sensor from the emitter of the second sensor when the end effector has been instructed to hold a substrate in the expected position and when the robot has been instructed to move the end effector to the target position while holding the substrate in the expected position, wherein the method further comprises:

implementing a first end effector action if said amount of light received by the receiver of the second sensor is equal to an amount of light emitted by the emitter of the second sensor;

implementing a second end effector action if said amount of light received by the receiver of the second sensor is less than the amount of light emitted by the emitter of the second sensor but greater than a predetermined threshold; and implementing a third end effector action if said amount of light received by the receiver of the second sensor is less than said threshold;

wherein the first, second, and third actions are different.

21. The method of claim 20, wherein the first action is based on a conclusion that the end effector is not in the target position, the second action is based on a conclusion that the end effector is in the target position but is not holding a substrate, and the third action is based on a conclusion that the end effector is in the target position and is holding a substrate in the expected position.

22. The method of claim 14, further comprising:
providing a substrate input/output chamber adjacent to the handling chamber;

providing an input/output port between the handling chamber and the input/output chamber, the input/output port being sized to allow the end effector to pass through the input/output port while the end effector is holding a substrate in the expected position;

providing an input/output position sensor positioned on a side of the handling chamber opposite the input/output port, the input/output sensor comprising a light beam emitter and a receiver, the emitter configured to emit a beam of light, the receiver configured to receive the light beam;

instructing the end effector to hold a substrate in the expected position;

instructing the robot to move the end effector to a second target position while holding the substrate in the expected position, wherein the second target position of the end effector is such that the proximal end of the end effector is near the input/output sensor, the end effector is substantially aligned with the input/output sensor and the input/output port, and the distal end of the end effector points toward the input/output port;

determining an amount of light received by the receiver of the input/output sensor from the emitter of the input/output sensor when the end effector has been instructed to hold a substrate in the expected position and when the robot has been instructed to move the end effector to the second target position while holding the substrate in the expected position;

implementing a first end effector action if said amount of light received by the receiver of the input/output sensor is equal to an amount of light emitted by the emitter of the input/output sensor;

implementing a second end effector action if said amount of light received by the receiver of the input/output sensor is less than the amount of light emitted by the emitter of the input/output sensor but greater than a predetermined threshold; and implementing a third end effector action if said amount of light received by the receiver of the input/output sensor is less than said threshold;

wherein the first, second, and third actions are different.

23. The method of claim 14, wherein providing the end effector comprises:

providing a paddle configured to underlie and support a substrate, the paddle having a distal end defining the distal end of the end effector, the paddle having one or more forward clamping elements configured to clamp against an edge of a substrate held by the end effector; and providing a proximal clamping member having one or more clamping elements configured to clamp against an edge of a substrate held by the end effector, the proximal clamping member being configured to move toward and away from the distal end of the end effector to clamp or unclamp a substrate between the clamping elements of the paddle and the clamping elements of the proximal clamping member, wherein said movement of the proximal clamping member with respect to the distal end of the end effector varies a position of the proximal end of the end effector with respect to the distal end of the end effector.

24. The method of claim 14, further comprising providing a second substrate transfer robot within the substrate handling chamber, comprising:

providing a second elongated end effector having a distal end and a proximal end, the second end effector configured to pick up and hold a semiconductor substrate at the distal end of the second end effector such that the substrate has the same expected position with respect to the second end effector every time the substrate is picked up and held by the second end effector; and providing a second robot actuator configured to move the second end effector within the chamber to transfer substrates among the plurality of substrate stations;

wherein the second end effector has a length such that it is possible for an edge of a substrate held by the second end effector in the expected position to partially block a light beam emitted from the emitter of one of the position sensors, while the proximal end of the second end effector partially blocks a light beam emitted from the emitter of the other position sensor.

25. A semiconductor processing apparatus, comprising:

a substrate handling chamber;

a second substrate chamber adjacent to the handling chamber;

a port between the handling chamber and the second chamber;

an end effector inside the handling chamber, the end effector comprising:

a paddle having a distal end defining a distal end of the end effector, the paddle having one or more clamping elements adapted to clamp against an edge of a substrate supported by the paddle; and a proximal clamping member having one or more proximal clamping elements adapted to clamp against an edge of a substrate supported by the paddle, the proximal clamping member adapted to move toward and away from the distal end of the paddle to clamp and unclamp a substrate between the clamping elements of the paddle and the clamping elements of the proximal clamping member, the proximal clamping member having a proximally extending structure that defines a proximal end of the end effector;

a robot actuator configured to move the end effector within the handling chamber to transfer substrates among a plurality of substrate stations;

a position sensor comprising:

a light beam emitter configured to emit a beam of light; and a receiver configured to receive the light beam; and a control system programmed to:

(a) instruct the robot actuator to move the end effector to a target position in which the end effector is oriented along a line extending from the sensor to the port, and in which the distal end of the paddle points toward the port; and (b) determine an amount of light received by the receiver from the emitter.

26. The semiconductor processing apparatus of claim 25, wherein said movement of the proximal clamping member with respect to the distal end of the end effector varies a position of the proximal end of the end effector with respect to the distal end of the end effector.

* * * * *

UNITED STATES PATENT AND TRADEMARK OFFICE
CERTIFICATE OF CORRECTION

| | | |
|---|---|---|
| PATENT NO. | : 8,041,450 B2 | |
| APPLICATION NO. | : 11/867525 | |
| DATED | : October 18, 2011 | |
| INVENTOR(S) | : Masahiro Takizawa et al. | |

It is certified that error appears in the above-identified patent and that said Letters Patent is hereby corrected as shown below:

At column 20, line 38, in Claim 14 change "sensors" to --sensor--.

Signed and Sealed this
First Day of May, 2012

David J. Kappos
*Director of the United States Patent and Trademark Office*